(12) United States Patent
Park et al.

(10) Patent No.: US 11,531,376 B2
(45) Date of Patent: Dec. 20, 2022

(54) DISPLAY DEVICE

(71) Applicant: Samsung Display Co., Ltd., Yongin-si (KR)

(72) Inventors: Jung Ho Park, Hwaseong-si (KR); Man Sik Myeong, Seoul (KR); Jae Chun Park, Seoul (KR); Jeong Il Yoo, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/601,586

(22) Filed: Oct. 15, 2019

(65) Prior Publication Data

US 2020/0133344 A1 Apr. 30, 2020

(30) Foreign Application Priority Data

Oct. 25, 2018 (KR) .......................... 10-2018-0128465

(51) Int. Cl.
*G06F 1/16* (2006.01)
*G02F 1/1333* (2006.01)

(52) U.S. Cl.
CPC ...... *G06F 1/1652* (2013.01); *G02F 1/133305* (2013.01); *G02F 1/133308* (2013.01); *G02F 2202/28* (2013.01)

(58) Field of Classification Search
CPC ............. G06F 1/1652; G02F 1/133305; G02F 1/133308; G02F 2202/28; Y02E 10/549; H01L 2227/323; H01L 51/5253; H01L 51/0097; G09F 9/301
See application file for complete search history.

(56) References Cited

U.S. PATENT DOCUMENTS

| 9,661,719 B2 | 5/2017 | Jang et al. |
| 10,268,242 B2 | 4/2019 | Seo et al. |
| 2011/0088931 A1* | 4/2011 | Lettow ................. C09D 177/00 174/257 |
| 2012/0318433 A1 | 12/2012 | Lim |

(Continued)

FOREIGN PATENT DOCUMENTS

| CN | 102856346 | 1/2013 |
| CN | 105679189 | 6/2016 |

(Continued)

OTHER PUBLICATIONS

Extended European Search Report dated Mar. 30, 2020 for European Patent Application No. 19205004.5.

*Primary Examiner* — Anthony J Frost
(74) *Attorney, Agent, or Firm* — H.C. Park & Associates, PLC

(57) ABSTRACT

A display device including a flexible module including a display panel; an adhesive film disposed on one surface of the flexible module; support plates disposed on the adhesive film; a first anti-adhesive film pattern disposed between each of the support plates and the adhesive film; and a second anti-adhesive film pattern disposed between each of the support plates and the adhesive film and spaced apart from the first anti-adhesive film pattern. Each of the first anti-adhesive film pattern and the second anti-adhesive film pattern includes a metal material, and each of the first anti-adhesive film pattern and the second anti-adhesive film pattern has a thickness in a range of 100 nm to 1000 nm.

38 Claims, 24 Drawing Sheets

(56) References Cited

U.S. PATENT DOCUMENTS

| | | | |
|---|---|---|---|
| 2014/0356567 A1* | 12/2014 | Park | B32B 7/14 |
| | | | 428/77 |
| 2016/0209874 A1* | 7/2016 | Choi | H05K 1/028 |
| 2016/0338219 A1* | 11/2016 | Seo | G06F 1/1652 |
| 2019/0305238 A1 | 10/2019 | Shin et al. | |
| 2020/0133344 A1 | 4/2020 | Park et al. | |

FOREIGN PATENT DOCUMENTS

| | | |
|---|---|---|
| CN | 106816530 | 6/2017 |
| EP | 3644383 | 4/2020 |
| JP | 2001234130 | 8/2001 |
| KR | 10-2012-0123030 | 11/2012 |
| KR | 10-2016-0034115 | 3/2016 |
| KR | 10-2016-0133053 | 11/2016 |
| KR | 10-2017-0072973 | 6/2017 |
| KR | 10-2017-0073304 | 6/2017 |
| KR | 10-2017-0111573 | 10/2017 |
| KR | 10-2018-0036323 | 4/2018 |

* cited by examiner

DISPLAY DEVICE

CROSS REFERENCE TO RELATED APPLICATION

This application claims priority from and the benefit of Korean Patent Application No. 10-2018-0128465, filed on Oct. 25, 2018, which is hereby incorporated by reference for all purposes as if fully set forth herein.

BACKGROUND

Field

Exemplary embodiments of the invention relate generally to a display device, and more specifically, to a display device which is switchable between a folded state and an unfolded state.

Discussion of the Background

A display device is a device for displaying an image, and includes a display panel, such as an organic light emitting display panel or a liquid crystal display panel.

A mobile electronic appliance includes a display device for providing an image to a user. A mobile electronic appliance having a larger display screen while having a volume or thickness equal to or smaller than a conventional electronic appliance has a larger weight, and a foldable display device or a bendable display device, having a structure that can be folded and unfolded to provide a larger screen only at the time of use, has been developed.

The above information disclosed in this Background section is only for understanding of the background of the inventive concepts, and, therefore, it may contain information that does not constitute prior art.

SUMMARY

Exemplary embodiments of the present invention provide a display device which overcomes defects resulting from repetitive state switching between a folded state and an unfolded state.

Additional features of the inventive concepts will be set forth in the description which follows, and in part will be apparent from the description, or may be learned by practice of the inventive concepts.

An exemplary embodiment of the present invention provides a display device including a flexible module including a display panel; an adhesive film disposed on one surface of the flexible module; support plates disposed on the adhesive film; a first anti-adhesive film pattern disposed between each of the support plates and the adhesive film; and a second anti-adhesive film pattern disposed between each of the support plates and the adhesive film and spaced apart from the first anti-adhesive film pattern. Each of the first anti-adhesive film pattern and the second anti-adhesive film pattern includes a metal material, and each of the first anti-adhesive film pattern and the second anti-adhesive film pattern has a thickness in a range of 100 nm to 1000 nm.

The support plates may include a first support plate and a second support plate which face the flexible module and are spaced apart from each other.

The first anti-adhesive film pattern may overlap the first support plate, and the second anti-adhesive film pattern may overlap the second support plate.

The first anti-adhesive film pattern and the second anti-adhesive film pattern may include the same material.

An adhesion force between the first anti-adhesive film pattern and the adhesive film may be greater than an adhesion force between the first anti-adhesive film pattern and the first support plate.

An adhesion force between the second anti-adhesive film pattern and the adhesive film may be greater than an adhesion force between the second anti-adhesive film pattern and the second support plate.

Each of the first anti-adhesive film pattern and the second anti-adhesive film pattern may have a thickness in a range of 200 nm to 400 nm.

The adhesive film may be in contact with both side surfaces of the first anti-adhesive film pattern and both side surfaces of the second anti-adhesive film pattern.

The display device may further include a first upper film pattern disposed between the first anti-adhesive film pattern and the adhesive film; and a second upper film pattern disposed between the second anti-adhesive film pattern and the adhesive film. Each of the first upper film pattern and the second upper film pattern may include an organic material or a metal oxide.

An adhesion force between the first anti-adhesive film pattern and the first upper film pattern may be greater than an adhesion force between the first anti-adhesive film pattern and the first support plate, and an adhesion force between the second anti-adhesive film pattern and the second upper film pattern may be greater than an adhesion force between the second anti-adhesive film pattern and the second support plate.

The first upper film pattern and the second upper film pattern may include the same material.

Each of the first upper film pattern and the second upper film pattern may have a thickness of 10 nm to 100 nm.

The display device may further include a first upper primer pattern disposed between the first upper film pattern and the first anti-adhesive film pattern; and a second upper primer pattern disposed between the second upper film pattern and the second anti-adhesive film pattern.

Each of the first upper primer pattern and the second upper primer pattern may include a non-metallic oxide material.

The first upper primer pattern and the second upper primer pattern may include the same material.

The display device may further include a first lower film pattern disposed between the first anti-adhesive film pattern and the first support plate; and a second lower film pattern disposed between the second anti-adhesive film pattern and the second support plate and separated from the first lower film pattern.

An adhesion force between the first lower film pattern and the first support plate may be greater than an adhesion force between the first lower film pattern and the first anti-adhesive film pattern, and an adhesion force between the second lower film pattern and the second support plate may be greater than an adhesion force between the second lower film pattern and the second anti-adhesive film pattern.

Each of the first lower film pattern and the second lower film pattern may include at least one of olefin molecules, silicone molecules, long-chain alkyl molecules, and fluorine molecules.

The first lower film pattern and the second lower film pattern may include the same material, and each of the first lower film pattern and the second lower film pattern has a thickness in a range of 10 nm to 100 nm.

the display device may further include a first lower primer pattern disposed between the first lower film pattern and the first support plate; and a second lower primer pattern disposed between the second lower film pattern and the second support plate.

Each of the first lower primer pattern and the second lower primer pattern may include a non-metallic oxide material.

The first lower primer pattern and the second lower primer pattern may include the same material.

The adhesive film may be in direct contact with the first support plate in a region not overlapping the first anti-adhesive film pattern, and the adhesive film may be in direct contact with the second support plate in a region not overlapping the second anti-adhesive film pattern.

The flexible module may be defined by a first non-folding region, a second non-folding region, and a folding region disposed between the first non-folding region and the second non-folding region, the first support plate overlaps the first non-folding region, the second support plate overlaps the second non-folding region, and a space between the first support plate and the second support plate overlaps the folding region.

The first anti-adhesive film pattern may overlap the first non-folding region, and the second anti-adhesive film pattern may overlap the second non-folding region.

Another exemplary embodiment of the present invention provides a display device including a flexible module including a display panel; an adhesive film disposed on one surface of the flexible module; support plates disposed on the adhesive film; a first anti-adhesive film pattern disposed between each of the support plates and the adhesive film; and a second anti-adhesive film pattern disposed between each of the support plates and the adhesive film and spaced apart from the first anti-adhesive film pattern, wherein each of the first anti-adhesive film pattern and the second anti-adhesive film pattern has a thickness in a range of 1000 nm to 2000 nm, and each of the first anti-adhesive film pattern and the second anti-adhesive film pattern includes an organic material.

The support plates may include a first support plate and a second support plate which face the flexible module and are spaced apart from each other.

The first anti-adhesive film pattern may overlap the first support plate, and the second anti-adhesive film pattern may overlap the second support plate.

The first anti-adhesive film pattern and the second anti-adhesive film pattern may include the same material.

The organic material may include polyurethane (PU).

An adhesion force between the first anti-adhesive film pattern and the adhesive film may be greater than an adhesion force between the first anti-adhesive film pattern and the first support plate, and an adhesion force between the second anti-adhesive film pattern and the adhesive film may be greater than an adhesion force between the second anti-adhesive film pattern and the second support plate.

The display device may further include a first lower film pattern disposed between the first anti-adhesive film pattern and the first support plate; and a second lower film pattern disposed between the second anti-adhesive film pattern and the second support plate and separated from the first lower film pattern.

An adhesion force between the first lower film pattern and the first support plate may be greater than an adhesion force between the first lower film pattern and the first anti-adhesive film pattern, and an adhesion force between the second lower film pattern and the second support plate may be greater than an adhesion force between the second lower film pattern and the second anti-adhesive film pattern.

Each of the first lower film pattern and the second lower film pattern may include at least one of olefin molecules, silicone molecules, long-chain alkyl molecules, and fluorine molecules.

The display device may further include a first connection pattern, one side thereof being connected to the first anti-adhesive film pattern and the other side thereof being connected to the second anti-adhesive film pattern.

The first connection pattern may be disposed to overlap a space between the first support plate and the second support plate.

The first connection pattern, the first anti-adhesive film pattern, and the second anti-adhesive film pattern may include the same material.

The display device may further include a second connection pattern, one side thereof being connected to the first lower film pattern and the other side thereof being connected to the second lower film pattern.

The second connection pattern may be disposed to overlap a space between the first support plate and the second support plate.

Another exemplary embodiment of the present invention provides a method of manufacturing a display device including disposing a masking pattern on a support plate to partially expose one surface of the support plate; depositing a metal material layer on the support plate and the masking pattern; removing the masking pattern from the one surface of the support plate to form a first anti-adhesive film pattern and a second anti-adhesive film pattern separated from the first anti-adhesive film pattern; disposing an adhesive film on the first anti-adhesive film pattern and the second anti-adhesive film pattern; and transferring the first anti-adhesive film pattern and the second anti-adhesive film pattern from the support plate to the adhesive film.

The disposing of the adhesive film on the first anti-adhesive film pattern and the second anti-adhesive film pattern may include attaching the first anti-adhesive film pattern and the second anti-adhesive film pattern to the adhesive film.

The method of manufacturing a display device may further include disposing a flexible module in a direction opposite to the support plate with the adhesive film therebetween and attaching the flexible module to the adhesive film.

Another exemplary embodiment of the present invention provides a method of manufacturing a display device including forming an organic material layer on a release film; patterning the organic material layer to form a first anti-adhesive film pattern and a second anti-adhesive film pattern separated from the first anti-adhesive film pattern; disposing the release film and the first anti-adhesive film pattern and second anti-adhesive film pattern formed on the release film on a support plate; separating the release film from the first anti-adhesive film pattern and the second anti-adhesive film pattern; disposing an adhesive film on the first anti-adhesive film pattern and the second anti-adhesive film pattern; and transferring the first anti-adhesive film pattern and the second anti-adhesive film pattern from the support plate to the adhesive film.

The disposing of the release film and the first anti-adhesive film pattern and second anti-adhesive film pattern formed on the release film on the support plate may include disposing the first anti-adhesive film pattern and the second anti-adhesive film pattern to face the support plate.

The disposing of the adhesive film on the first anti-adhesive film pattern and the second anti-adhesive film pattern may include attaching the first anti-adhesive film pattern and the second anti-adhesive film pattern to the adhesive film.

The method of manufacturing a display device may further include disposing a flexible module in a direction opposite to the support plate with the adhesive film therebetween and attaching the flexible module to the adhesive film.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
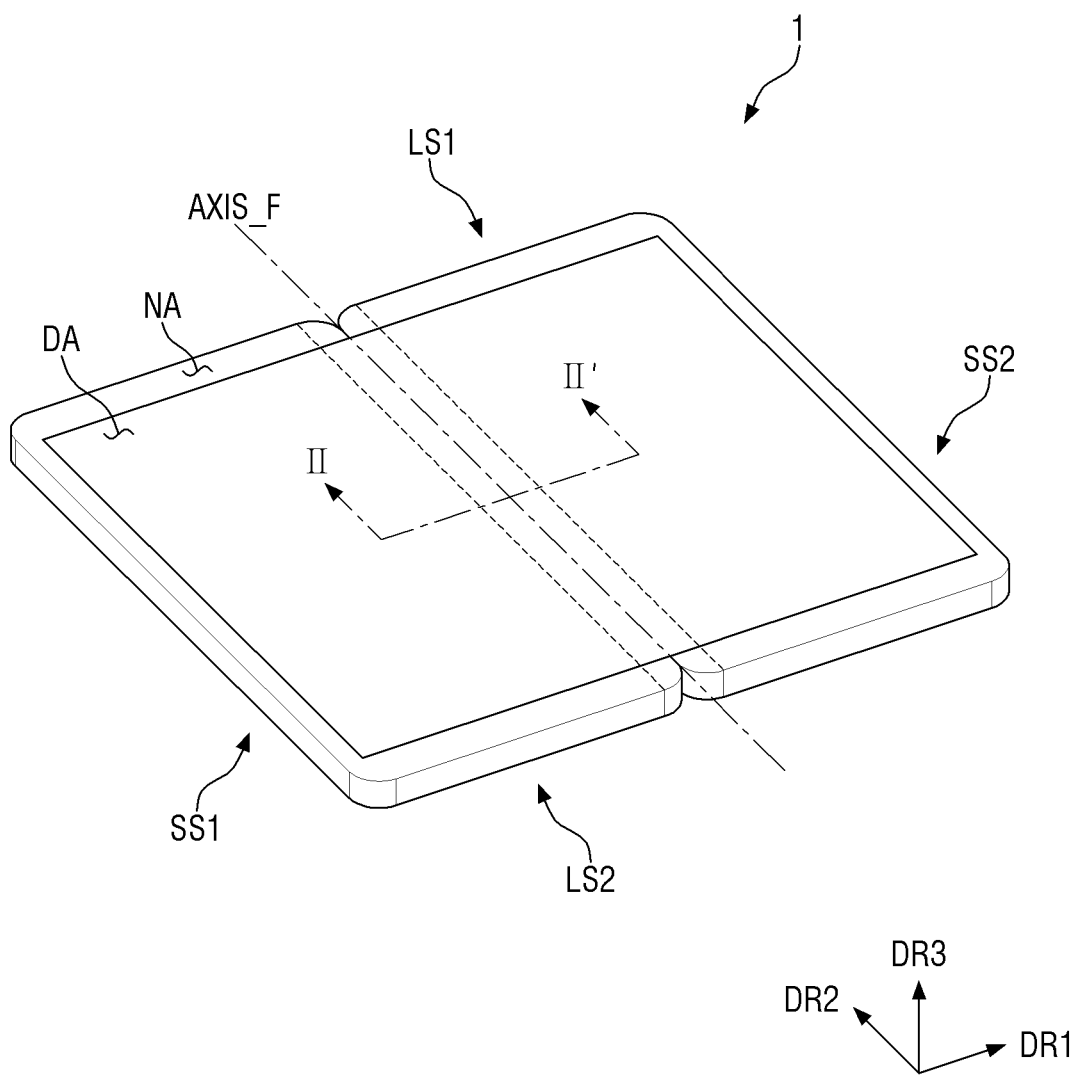
FIG. 1 is a perspective view of a display device according to an exemplary embodiment.

In the following description, for the purposes of explanation, numerous specific details are set forth in order to provide a thorough understanding of various exemplary embodiments of the invention. As used herein "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
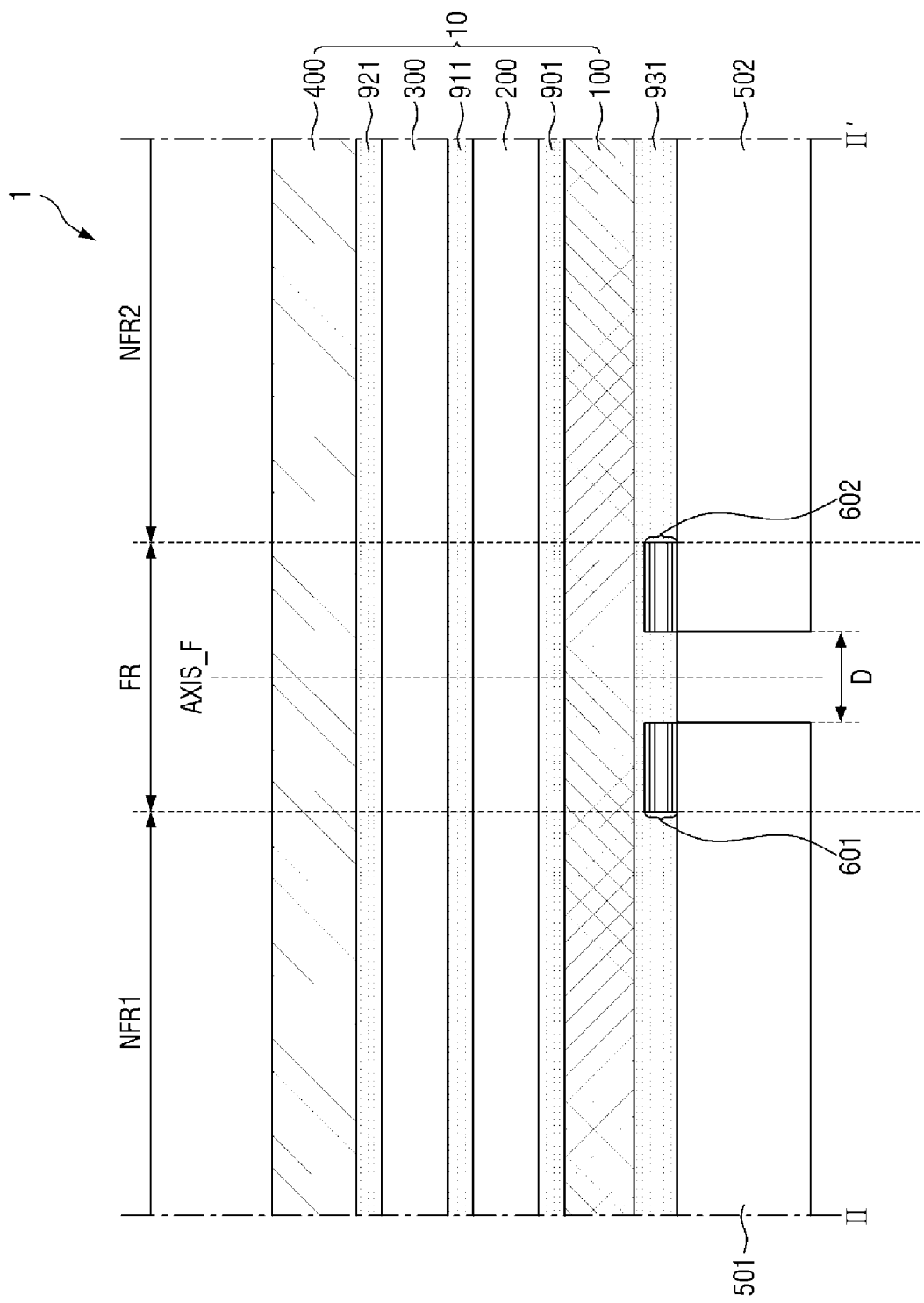
FIG. 2 is a cross-sectional view taken along the line II-II' of FIG. 1.
Figure 3:
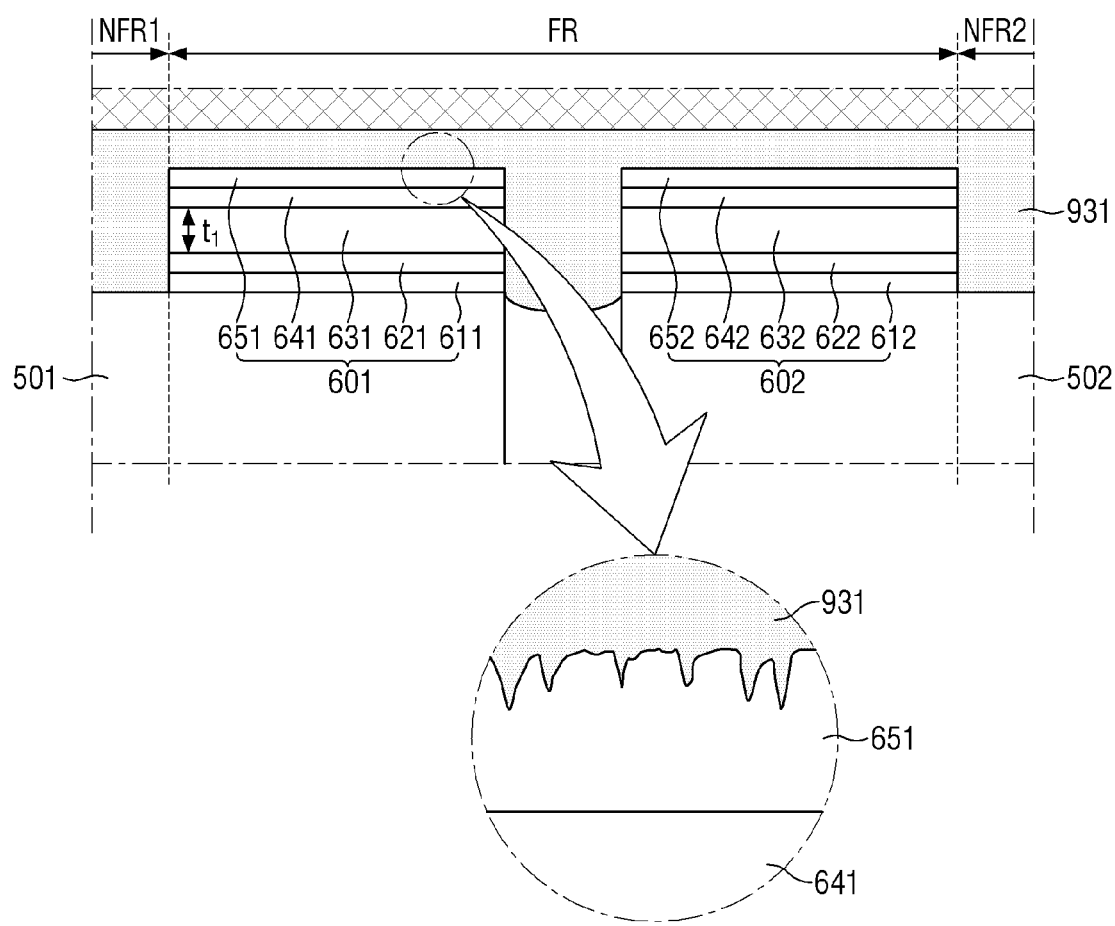
FIG. 3 is an enlarged view of a lower surface (or a back surface) of a flexible module of the display device according to an exemplary embodiment.
Figure 4:
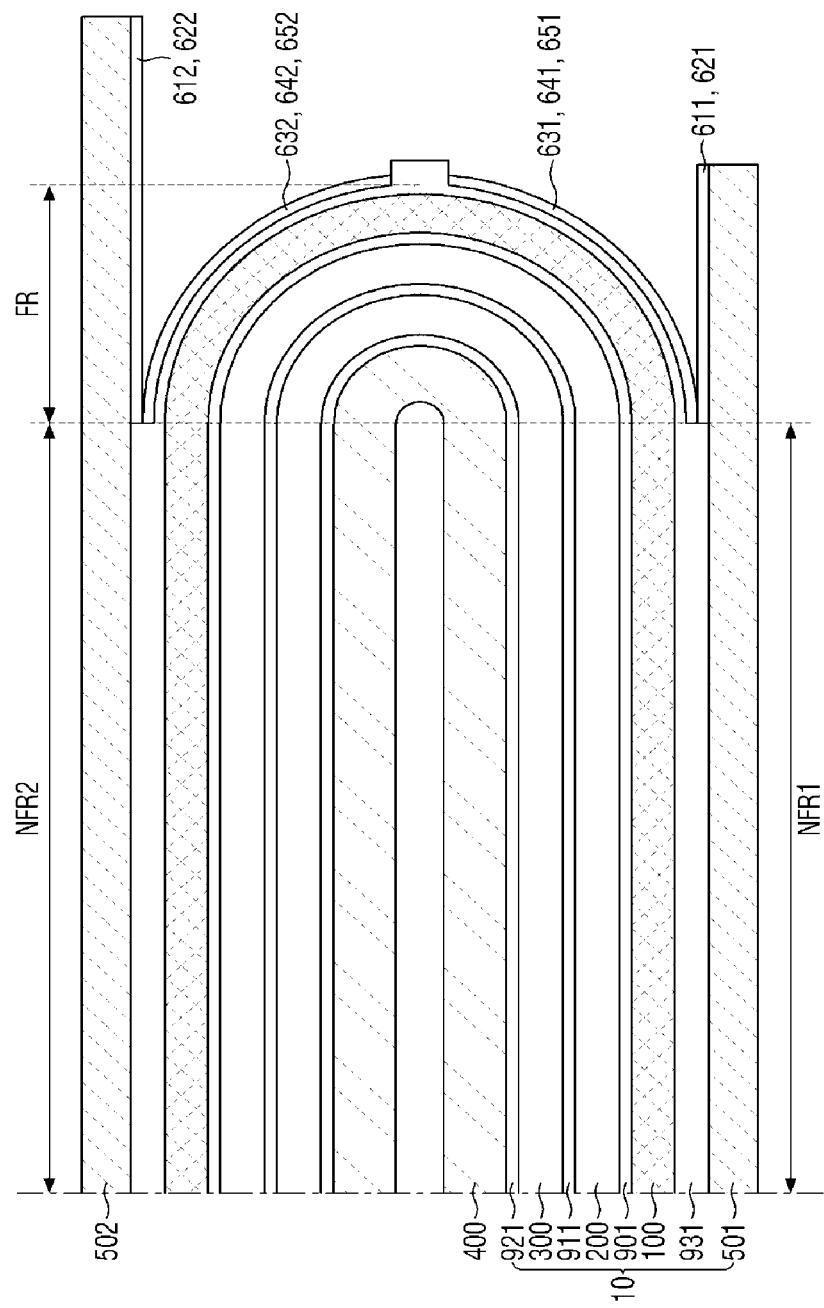
FIG. 4 is a cross-sectional view illustrating a folded state of the display device according to an exemplary embodiment.
Figure 5:
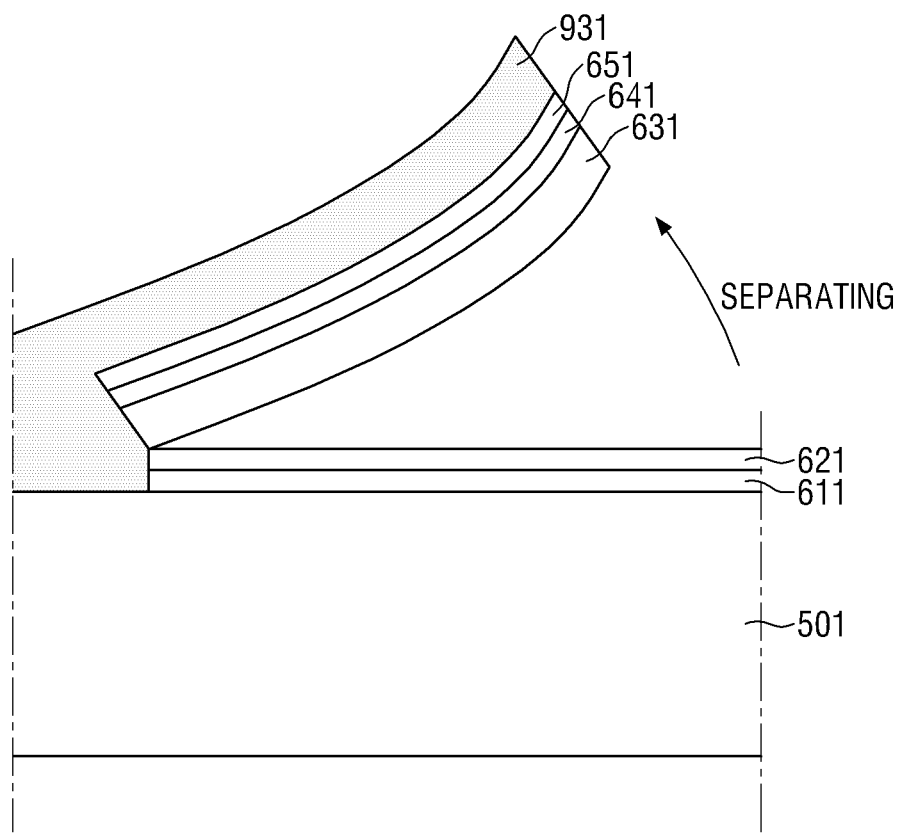
FIG. 5 is a view illustrating a state switching from a unfolded state to a folded state of the display device according to an exemplary embodiment.

FIG. 1 is a perspective view of a display device according to an exemplary embodiment; FIG. 2 is a cross-sectional view taken along the line II-II' of FIG. 1; FIG. 3 is an enlarged view of a lower surface (or a back surface) of a flexible module of the display device according to an exemplary embodiment; FIG. 4 is a cross-sectional view illustrating a folded state of the display device according to an exemplary embodiment; and FIG. 5 is a view illustrating a state switching from a unfolded state to a folded state of the display device according to an exemplary embodiment.

Referring to FIGS. 1 to 5, a display device 1 may be a flexible display device. As used herein, "foldable" may refer to a flexible state, and specifically is a term designated by including bendable and rollable. Furthermore, "folding" should be interpreted as including any of "partially folding", "entirely folding", "in folding", and "out folding".

The display device 1 may include a folding axis AXIS_F that traverses the upper and lower sides of the display device at the plan view. The display device may be folded based on the folding axis AXIS_F.

The display device 1 may have a substantially planar rectangular shape having vertically planar edges or a rectangular shape having rounded edges. The display device 1 may include four edges LS1, LS2, SS1, and SS2. The display device 1 may include long-side edges LS1 and LS2 and short-side edges SS1 and SS2. For example, the long-side edges LS1 and LS2 may extend in a first direction DR1, and the short-side edges SS1 and SS2 may extend in a second direction DR2.

As shown in FIG. 1, the folding axis AXIS_F may extend in a direction traversing the long-side edges LS1 and LS2, for example, in the second direction DR2. In this case, the long-side edges LS1 and LS2 of the display device 1 may be folded. Unlike what is shown in FIG. 1, the folding axis AXIS_F may extend to traverse the short-side edges SS1 and SS2. In this case, the short-side edges SS1 and SS2 of the display device 1 may be folded. Hereinafter, for convenience of explanation, the present invention will be mainly described based on a case where the folding axis AXIS_F extends to traverse the long-side edges LS1 and LS2. The folding axis AXIS_F may traverse the center portion of each long-side edges LS1, LS2, but the present invention is not limited thereto.

Meanwhile, as used herein, the terms "upper portion" and "upper surface" in the thickness direction refer to a display direction, and "lower portion" and "lower surface" refer to a direction opposite to the display direction, unless otherwise defined. In addition, the terms "upper", "lower", "left", and "right" at the plan view represent directions when viewed from the top based on the display surface at a correct position.

The display device 1 may include a display area DA and a non-display area NA disposed around the display area DA. The display area DA is an area where an image is displayed, and the non-display area NA is an area where an image is not displayed. The display area DA may be located at the center of the display device 1. In a state where the display device 1 is folded, in the display area DA, regions divided by the folding axis AXIS_F may overlap each other, and in a state where the display device 1 is unfolded again, in the display area DA, an image may be displayed in a state where the respective regions are unfolded.

A groove (for example, a notch) recessed downward/upward on the plane is formed in a region adjacent to the first long-side edge LS1 and second long-side edge LS2 of the display device 1, each meeting the folding axis AXIS_F, and a hinge member (not illustrated) or the like for state switching may be coupled to the recessed portion. However, the inventive concepts are not limited thereto.

Referring to FIG. 2, the display device 1 may be divided into a folding region FR and non-folding regions NFR1 and NFR2 based on the folding axis AXIS_F.

That is, the display device 1 may include a folding region FR located at the center of the display device and including the folding axis AXIS_F and non-folding regions NFR1 and NFR2 spaced apart from each other with the folding region therebetween.

The folding region FR may be a region where the display device 1 is folded or bent with a predetermined curvature in the folding direction, and the non-folding regions NFR1 and NFR2, unlike the folding region FR, may be regions where the display device 1 is not folded. Each of the non-folding regions NFR1 and NFR2 may be a flat region located on the same plane, but may be a partially bent region without limitations.

The display device 1 may include a flexible module 10, as shown in FIG. 2. The flexible module 10 may include a plurality of laminated members. The flexible module 10 may include a display panel 200, a lower functional layer 100 disposed under the display panel 200, an upper functional layer 300 disposed over the display panel 200, and a window 400 disposed over the upper functional layer 300.

The lower functional member 100 may be disposed at the bottom of the flexible module 10. The lower functional member 100 may include at least one functional layer. The functional layer may be a layer that performs a buffering function, a heat dissipation function, an electromagnetic wave blocking function, a grounding function, a strength enhancing function, a support function, a pressure sensing function, a digitizing function, and the like. The lower functional member 100 may be made of a single layer. However, the inventive concepts are not limited thereto, and lower functional member 100 may be made of different laminated functional layers.

For example, the lower functional member 100 may include a buffer member. The buffer member may prevent the impact applied from the outside (for example, the downward direction of the lower functional member 100) from being transmitted to the display panel 200. The buffer member may be formed of a foam material, for example, polyurethane (PU), thermoplastic polyurethane (TPU), silicon (Si), or polydimethylacrylamide (PDMA).

The lower functional member 100 may have lower light transmittance than a plurality of members disposed over the display panel 200 to be described later. The layers disposed over the display panel 200 may have relatively high light transmittance to transmit the light emitted from the display area upward. In contrast, the lower functional member 100 may have relatively low light transmittance to block the light from the display area downward.

The display panel 200 may be disposed over the lower functional member 100.

The display module 200 may display an image by an input data signal. As the display module 200, as an organic light emitting display panel, a liquid crystal display panel, a plasma display panel, an electrophoretic display panel, an electrowetting display panel, a quantum dot light emitting display panel, or a micro light emitting diode (LED) display panel may be applied. In an exemplary embodiment, an organic light emitting display panel is represented by the display panel 200.

The display panel 200 may include a flexible substrate including a flexible polymer material, such as polyimide (PI). Accordingly, the display panel 200 may be bent, warped, folded, or rolled. The display panel 200 may have a shape similar to the planar shape of the display device 1.

A plurality of pixels PX may be arranged in the display area DA of the display panel 200, and signal lines and drive circuits for applying signals to the respective pixels PX may be arranged in the non-display area NA of the display panel 200. Further, the non-display area NA may be provided with a black matrix having a shape of a rectangular frame in a plan view.

The pixel PX may include a light emitting layer and a circuit layer for controlling the amount of light emitted from the light emitting layer. The circuit layer may include a plurality lines, a plurality of electrodes, and at least one transistor. In an exemplary embodiment, the light emitting layer may include an organic light emitting material. The light emitting layer may be encapsulated by an encapsulation film. The encapsulation film may encapsulate the light emitting layer to prevent moisture and the like from inflowing from the outside. The encapsulation film may be an inorganic single-layer film or an inorganic multi-layer film, or may be a laminated film in which inorganic films and organic films are alternately laminated.

The upper functional member 300 may be disposed over the display panel 200.

The upper functional member 300 may include at least one functional layer. The functional layer may be a layer that performs a touch sensing function, a color filtering function, a color conversion function, a polarization function, an anti-reflection function, a biometric information recognition function (for example, a fingerprint recognition function). The upper functional member 300 may include, for example, an anti-reflection member. The functional layer may be a sheet layer, a film layer, a thin film layer, a coating layer, a panel, or a plate. The upper functional member 300 may be formed of one single functional layer. However, the inventive concepts are not limited thereto, and the upper functional member 300 may be a laminate of different functional layers.

The window 400 may be disposed over the upper functional member 300.

The window 400 covers and protects the underlying members 100, 200, and 300. The window 400 may be made of glass, quartz, or the like. The thickness of the window 400 may be less than 100 µm. When the thickness of the window 400 is small, stress is reduced at the time of folding, and degree of deformation of a structure may be insufficient even if a folded state and an unfolded state are repeated. In some exemplary embodiments, the window may include chemically-reinforced ultrathin glass (UTG).

The flexible module 10 may include a plurality of adhesive films 901, 911, and 921 coupling these members 100, 200, 300, and 400, with each located between them. The first adhesive film 901 may be disposed between the lower functional member 100 and the display panel 200 to couple them with each other; the second adhesive film 911 may disposed between the display panel 200 and the upper functional member 300 to attach them to each other; and the third adhesive film 921 may be disposed between the upper functional member 300 and the window 400 to attach them to each other.

Each of the plurality of adhesive films 901, 911, 921 is a film having adhesive properties on both upper and lower surfaces, and may be, for example, a pressure sensitive adhesive (PSA) film, an optical clear adhesive (OCA) film, or an optical clear resin (OCR) film. Each of the plurality of adhesive films 901, 911, 921 may include an acrylic resin or a silicon-based resin. Further, each of the plurality of adhesive films 901, 911, 921 may have an elongation rate of 100% to 1,000%.

The display device 1 may include support plates 501 and 502, a fourth adhesive film 931, and anti-adhesive films 601 and 602.

The support plates 501 and 502 may prevent the display panel 200 from being bent by an external force or can alleviate the degree of bending (for example, bending angle or bending curvature radius). That is, the support plates 500 may maintain the display panel 200 in a relatively flat state even if an external force is applied.

The support plates 501 and 502 may include a rigid or semi-rigid material. Specifically, the support plates 501 and 502 may include a metal material, such as stainless steel (SUS) or aluminum, or a polymer material, such as polymethyl metacrylate (PMMA), polycarbonate (PC), polyvinylalcohol (PVA), acrylonitirle-butadiene-styrene (ABS), or polyethylene terephthalate (PET). For example, each of the support plates 501 and 502 may be a stainless steel film having a thickness of 150 µm to 200 µm. As another example, each of the support plates 501 and 502 may be an aluminum film having a thickness of 150 µm to 200 µm.

In some exemplary embodiments, the support plates 501 and 502 may be a first support plate 501 and a second support plate 502, which are spaced apart from each other. The first support plate 501 may be disposed over the first non-folding region NFR1 and a part of the folding region FR. The second support plate 502 may be disposed over the second non-folding region NFR2 and a part of the folding region FR. The first support plate 501 may be spaced apart from the second support plate 502 by a predetermined distance D, based on the folding axis AXIS_F. For example, the distance D may be 50 µm or less.

Anti-adhesive films 601 and 602 may be disposed between the support plates 501 and 502 and the lower functional member 100. Specifically, the first anti-adhesive pattern 601 may be disposed between the first support plate 501 and the lower functional member 100, and the second anti-adhesive pattern 602 may be disposed between the second support plate 502 and the lower functional member 100. The anti-adhesive films 601 and 602 may be spaced apart from each other. The anti-adhesive films 601 and 602 may overlap the folding region FR. The anti-adhesive films 601 and 602 may be aligned with the inner surfaces of the support plates 501 and 502 in the thickness direction, respectively.

The anti-adhesive films 601 and 602 may serve to prevent the support plates 501 and 502 in the folding region FR from being attached to the overlaying flexible module. Details thereof will be described later.

The fourth adhesive film 931 may be disposed between the support plates 501 and 502 and the lower functional member 100 and between the anti-adhesive films 601 and 602 and the lower functional member 100. The fourth adhesive film 931 may be disposed to overlap the non-folding regions NFR1 and NFR2 and the folding region FR. That is, the fourth adhesive film 931 may be disposed over the entire one surface of the lower functional member 100.

The fourth adhesive film 931 may attach the support plates 501 and 502 to the lower functional member 100 in the non-folding regions NFR1 and NFR2, and may attach the anti-adhesive patterns 601 and 602 to the lower functional member 100 in the folding region FR. The fourth adhesive film 931 may include the same material as the above-described adhesive films 901, 911, and 921. For example, the fourth adhesive film 931 may be a pressure sensitive adhesive (PSA) film, but is not limited thereto.

The fourth adhesive film 931 may be disposed between the support plates 501 and 502 and the lower functional member 100 in the non-folding regions NFR1 and NFR2, and may be disposed between the anti-adhesive patterns 601 and 602 and the lower functional member 100 in the folding region FR. The fourth adhesive film 931 may cover all the outer surfaces and inner surfaces of the anti-adhesive patterns 601 and 602. However, the inventive concepts are not limited thereto, and, as shown in FIG. 3, the fourth adhesive film 931 may partially fill a space between the support plates 501 and 502.

In this exemplary embodiment, the fourth adhesive film 931 is exemplified as an adhesive member separated from the flexible module 19, but the inventive concepts are not so limited, and the fourth adhesive film 931 may be included in the flexible module 10 and disposed on the bottom surface of the flexible module 10.

Each of the anti-adhesive patterns may include a plurality of laminated films. Details thereof will be described with reference to FIG. 3.

Referring to FIG. 3, the first anti-adhesive pattern 601 may include a first lower primer pattern 611, a first lower film pattern 621, a first anti-adhesive film pattern 631, a first upper primer pattern 641, and a first upper film pattern 651. The second anti-adhesive pattern 602 may include a second lower primer pattern 612, a second lower film pattern 622, a second anti-adhesive film pattern 632, a second upper primer pattern 642, and a second upper film pattern 652.

The plurality of laminated films 611, 621, 631, 641, and 651 of the first anti-adhesive pattern 601 may be aligned with the inner surface of the first support plate 501 in the thickness direction. Similarly, the plurality of laminated films 612, 622, 632, 642, and 652 of the second anti-adhesive pattern 602 may be aligned with the inner surface of the second support plate 502 in the thickness direction.

The lower primer patterns 611 and 612 may be disposed on the support plates 501 and 502, respectively. That is, the first lower primer pattern 611 may be disposed on the first support plate 501, and the second lower primer pattern 612 may be disposed on the second support plate 502. The first lower primer pattern 611 may be separated from the second lower primer pattern 612 with a space between the support plates 501 and 502.

The lower primer patterns 611 and 612 may further facilitate the bonding of the lower film patterns 621 and 622 to the support plates 501 and 502. The lower primer patterns 611 and 612 may include a material that facilitates the bonding of the lower film patterns 621 and 622 to the support plates 501 and 502. The lower primer patterns 611 and 612 may include an inorganic material. For example, the lower primer patterns 611 and 612 may include a metal oxide material or a non-metal oxide material as an inorganic material. Examples of the metal oxide material or non-metal oxide material may include $CuO$, $K_2O$, $Li_2O$, $Na_2O$, $CeO_2$, $ZnO$, $Al_2O_3$, $B_2O_3$, $Cr_2O_3$, $SnO_2$, $Sb_2O_3$, $MnO_2$, $MoO_3$, $P_2O_5$, $SiO_2$, $TiO_2$, $V_2O_5$, $WO_3$, and $ZrO_2$. In another exemplary embodiment, the lower primer patterns 611 and 612 may include an acrylic, ester-based, urethane-based or siloxane-based polymer material.

The first lower primer pattern 611 and the second lower primer pattern 612 may include the same material.

The lower film patterns 621 and 622 may be disposed on the lower primer patterns 611 and 612, respectively. That is, the first lower film pattern 621 may be disposed on the first lower primer pattern 611, and the second lower film pattern 622 may be disposed on the second lower film pattern 612. The first lower film pattern 621 may be separated from the second lower film pattern 622 with a space between the support plates 501 and 502.

The lower film patterns 621 and 622 may be surface-treated to improve the detachability with the overlying laminated film. This surface treatment may be performed on one surface of the lower film layer 621 and 622 facing the overlying laminated film.

The lower film patterns 621 and 622 may serve to weaken the bonding force between the anti-adhesive film patterns 631 and 632 and the support plates 501 and 502. Moreover, the lower film patterns 621 and 622 may prevent the fourth adhesive film 931 flowing between the overlying laminated films from being bonded to the lower support plates 501 and 502. Each of the lower film patterns 621 and 622 may have a thickness of in a range of about 10 nm to about 100 nm.

The above surface treatment is not limited, but may include a peeling treatment, such as an olefin treatment, a silicone treatment, a long-chain alkyl treatment, and a fluorine treatment. Due to this surface treatment, the surface of each of the lower film patterns 621 and 622 may include olefin molecules, silicone molecules, long-chain alkyl molecules, or fluorine molecules to reduce the adhesion to the overlying laminated film. As the surface treatment, surface treatment the same as, or similar to, invisible fingerprint (IF) surface treatment may further be used.

The first lower film pattern 621 and the second lower film pattern 622 may include the same material.

The lower film patterns 621 and 622 may be attached to the lower primer patterns 611 and 612, respectively.

The anti-adhesive film patterns 631 and 632 may be disposed on the lower film patterns 621 and 622, respectively. That is, the first anti-adhesive film pattern 631 may be disposed on the first lower film pattern 621, and the second anti-adhesive film pattern 632 may be disposed on the second lower film pattern 622. The first anti-adhesive film pattern 631 may be separated from the second anti-adhesive film pattern 632 with a space between the support plates 501 and 502.

As shown in FIG. 3, while the display device 1 is folded, the fourth adhesive film 931 is exposed to the outside in the folding region FR. In this case, foreign matter or the like may adhere to the exposed area of the fourth adhesive film 931, which may cause the performance deterioration of the adhesive film and the internal deformation of the adhesive film. The anti-adhesive film patterns 631 and 632 may externally cover the exposed area of the fourth adhesive film 931, thereby preventing foreign matter or the like from adhering to the fourth adhesive film 931.

Further, the anti-adhesive patterns 631 and 632 may serve to prevent the overlying flexible module 10 from being attached to the support plates 501 and 502.

The anti-adhesive patterns 631 and 632 may include a metal material. Examples of the metal material may include aluminum (Al), platinum (Pt), palladium (Pd), silver (Ag), magnesium (Mg), gold (Au), nickel (Ni), neodymium (Nd), iridium (Ir), calcium (Ca), titanium (Ti), tantalum (Ta), tungsten (W), copper (Cu), and molybdenum (Mo). The anti-adhesive patterns 631 and 632 may include at least one of the aforementioned materials.

The first anti-adhesive pattern 631 and the second anti-adhesive pattern 632 may include the same material.

Each of the anti-adhesive patterns 631 and 632 may have a first thickness t1. The first thickness t1 may be in a range of about 100 nm to about 2000 nm. The first thickness t1 of each of the anti-adhesive patterns 631 and 632 may be considered in terms of durability and thinning.

Specifically, when the state switching of an unfolded state and a folded state is repeated, surface cracks and internal cracks of each of the anti-adhesive film patterns 631 and 632 may occur. In this case, when each of the anti-adhesive film patterns 631 and 632 has a thickness of about 200 nm or more, even if surface cracks or internal cracks occur due to the state switching, it is possible to prevent each of the anti-adhesive film patterns 631 and 632 from being contact with the underlying support plates 501 and 502 by allowing an adhesive material of the overlying fourth adhesive film 931 to completely penetrate the anti-adhesive films 631 and 632.

The anti-adhesive film patterns 631 and 632 may be viewed in the form of a pattern from the outside through a display surface. Specifically, the anti-adhesive film patterns 631 and 632 may include a different material from the fourth adhesive film 931, and thus, the anti-adhesive film patterns 631 and 632 may be viewed in a pattern distinct from the fourth adhesive film 931 by the light incident through the display surface. However, when the first thickness t1 of each of the anti-adhesive film patterns 631 and 632 is about 1000 nm or less, the anti-adhesive film patterns 631 and 632 may not be viewed from the outside, or degree of viewing the anti-adhesive film patterns 631 and 632 may be insufficient. Accordingly, the first thickness t1 of each of the anti-adhesive film patterns 631 and 632 may be about 200 nm to about 1000 nm. In order to further prevent pattern visibility through the display surface, the first thickness t1 may preferably be about 200 nm to 400 nm.

The upper primer patterns 641 and 642 may be disposed on the anti-adhesive film patterns 631 and 632, respectively. The first upper primer pattern 641 may be separated from the second upper primer pattern 642 with a space between the support plates 501 and 502. The upper primer patterns 641 and 642 may include at least one of the materials described in the lower primer patterns 611 and 612. The first upper primer pattern 641 and the second upper primer pattern 642 may include the same material.

The upper primer patterns 641 and 642 may be respectively bonded to the underlying anti-adhesive film patterns 631 and 632, and may be respectively bonded to the overlying upper film patterns 651 and 652. Since the underlying lower film patterns 621 and 622 hardly have adhesion to the anti-adhesive patterns 631 and 632, these lower film patterns 621 and 622 may not be bonded to the anti-adhesive film patterns 631 and 632, but may be partially bonded thereto. However, even when the lower film patterns 621 and 622 are slightly bonded to the anti-adhesive film patterns 631 and 632, the adhesion force between the anti-adhesive film patterns 631 and 632 and the underlying lower film patterns 621 and 622 may be less than the adhesion force between the anti-adhesive film patterns 631 and 632 and the overlying upper primer patterns 641 and 642.

Moreover, the adhesion force between the anti-adhesive film patterns 631 and 632 and the lower film patterns 621 and 622 may be less than the adhesion force between other layers.

Specifically, the adhesion force between the anti-adhesive film patterns 631 and 632 and the lower film patterns 621 and 622 may be less than the adhesion force between the support plates 501 and 502 and the lower primer patterns 611 and 612, the adhesion force between the lower primer patterns 611 and 612 and the lower film patterns 621 and 622, the adhesion force between the anti-adhesive film patterns 631 and 632 and the upper primer patterns 641 and 642, and the adhesion force between the upper primer patterns 641 and 642 and the upper film patterns 651 and 652.

The upper film patterns 651 and 652 may be disposed on the upper primer patterns 641 and 642, respectively. The first upper film pattern 651 may be separated from the second upper film pattern 652 with a space between the first support plate 501 and the second support plate 502. The upper film patterns 651 and 652 may be attached to the fourth adhesive film 931 and the underlying upper primer patterns 641 and 642, respectively. That is, the upper film patterns 651 and 652 may serve to increase the adhesion force between the anti-adhesive film patterns 631 and 632 and the fourth adhesive film 931.

The thickness of each of the upper film patterns 651 and 652 may be in a range of about 10 nm to about 100 nm.

In some exemplary embodiments, the upper film patterns 651 and 652 may include an organic material. Examples of the organic material may include an acrylic resin, an epoxy resin, a phenolic resin, a polyamide resin, a polyimide resin, an unsaturated polyester resin, a polyphenylene ether resin, a polyphenylene sulfide resin, and benzocyclobutene (BCB).

When the organic material is used, the adhesion force between the anti-adhesive film patterns 631 and 632 and the fourth adhesive film 931 may be further improved.

In another exemplary embodiment, the upper film patterns 651 and 652 may include a metal oxide material. Examples of the metal oxide material may include $CuO$, $K_2O$, $Li_2O$, $Na_2O$, $CeO_2$, $ZnO$, $Al_2O_3$, $B_2O_3$, $Cr_2O_3$, $SnO_2$, $Sb_2O_3$, $MnO_2$, $MoO_3$, $P_2O_5$, $SiO_2$, $TiO_2$, $V_2O_5$, $WO_3$, and $ZrO_2$.

Since the metal oxide material has a higher film density than the material constituting the anti-adhesive film patterns 631 and 632, as shown in FIG. 3, even when cracks occur on one surface of each of the upper film patterns 651 and 652 facing the fourth adhesive film 931, due to high film density, it is possible to more effectively prevent the material of the fourth adhesive film 931 from being introduced into the support plates 501 and 502.

The first upper film pattern 651 and the second upper film pattern 652 may include the same material.

In this exemplary embodiment, it is exemplified that the first anti-adhesive patterns 601, in which the first lower primer pattern 611, the first lower film pattern 621, the first anti-adhesive film pattern 631, the first upper primer pattern 641, and the first upper film pattern 651 are sequentially laminated, and that the second anti-adhesive pattern 602 in which the second lower primer pattern 612, the second lower film pattern 622, the second anti-adhesive film pattern 632, the second upper primer pattern 642, and the second upper film pattern 652 are sequentially laminated. However, the inventive concepts are not limited thereto. In other words, the anti-adhesive patterns 601 and 602 include anti-adhesion film patterns 631 and 632, respectively. Further, any one of the underlying lower primer patterns 611 and 612, the underlying lower film patterns 621 and 622, the overlying upper primer patterns 641 and 642, and overlying upper film patterns 651 and 652 may be omitted. Hereinafter, details thereof will be described.

In some exemplary embodiments, the anti-adhesive patterns 601 and 602 may include anti-adhesive film patterns 631 and 632, respectively. The anti-adhesive film patterns 631 and 632 may be disposed on one surfaces of the support plates 501 and 502, respectively, and the upper surfaces of the anti-adhesive film patterns 631 and 632 may be bonded to the fourth adhesive film 931, respectively.

The adhesion force between the anti-adhesive film patterns 631 and 632 and the fourth adhesive film 931 may be larger than the adhesion force between the anti-adhesive film patterns 631 and 632 and the support plates 501 and 502.

In another exemplary embodiment, the anti-adhesive patterns 601 and 602 may include the anti-adhesive film patterns 631 and 632 and the lower film patterns 621 and 622, respectively. The lower film patterns 621 and 622 may be disposed on the support plates 501 and 502, respectively, the anti-adhesive film patterns 631 and 632 may be disposed on the lower film patterns 621 and 622, respectively, and each of the upper surfaces of the anti-adhesive film patterns 631 and 632 may be bonded to the fourth adhesive film 931.

The adhesion force between the lower film patterns 621 and 622 and the anti-adhesive film patterns 631 and 632 may be less than the adhesion force between the lower film patterns 621 and 622 and the support plates 501 and 502. The adhesion force between the anti-adhesive film patterns 631 and 632 and the lower film patterns 621 and 622 may be less than the adhesion force between the anti-adhesive film patterns 631 and 632 and the fourth adhesive film 931.

In some exemplary embodiments, the lower primer patterns 611 and 612 may further be disposed between the lower film patterns 621 and 622 and the support plates 501 and 502, respectively. In this case, the lower primer patterns 611 and 612 may be disposed on the support plates 501 and 502, respectively, and the lower film patterns 621 and 622 may be disposed on the lower primer patterns 611 and 612, respectively.

In still another exemplary embodiment, the anti-adhesive patterns 601 and 602 may include the anti-adhesive film patterns 631 and 632 and the upper film patterns 651 and 652, respectively. The anti-adhesive film patterns 631 and 632 may be disposed on the support plates 501 and 502, respectively, and the upper film patterns 651 and 652 may be disposed on the anti-adhesive film patterns 631 and 632, respectively. Each of the upper surfaces of the upper film patterns 651 and 652 may be bonded to the fourth adhesive film 931.

The adhesion force between the anti-adhesive film patterns 631 and 632 and the support plates 501 and 502 may be less than the adhesion force between the anti-adhesive film patterns 631 and 632 and the upper film patterns 651 and 652. In other words, the adhesion force between the anti-adhesive film patterns 631 and 632 and the upper film patterns 651 and 652 may be greater than the adhesion force between the anti-adhesive film patterns 631 and 632 and the support plates 501 and 502.

In some exemplary embodiments, the upper primer patterns 641 and 642 may further be disposed between the upper film patterns 651 and 652 and the anti-adhesive film patterns 631 and 632, respectively. In this case, the upper primer patterns 641 and 642 may be disposed on the anti-adhesive film patterns 631 and 632, respectively, and the upper film patterns 651 and 652 may be disposed on the upper primer patterns 641 and 642, respectively.

Hereinafter, an operation of the display device 1 according to an exemplary embodiment will be described in detail.

Referring to FIGS. 4 and 5, the flexible module 10 and the fourth adhesive film 931 are folded with a predetermined curvature by an external force in the folding region FR, but may not be folded by an external force in the non-folding regions NFR1 and NFR2. That is, the flexible module 10 and the fourth adhesive film 931 may be located on the flat surfaces constituting the same plane in the non-folding regions NFR1 and NFR2, respectively.

When an external force is applied to one side of the display device 1, for example, the right side thereof along the folding direction (upward direction in FIG. 3), the folding region FR may be bent or folded, and the second non-folding region NFR2 may overlap or face the first non-folding region NFR1 while moving or rotating along the folding direction.

Meanwhile, when the support plates 501 and 502 are made of a rigid material and are folded, bending stress may occur. The bending stress may be transmitted to the overlying flexible module 10 to cause defects.

Thus, it is preferable that the support plates 501 and 502 and the flexible module are not bonded to each other in the folding region FR. In this exemplary embodiment, since the anti-adhesive patterns 601 and 602 are formed on the folding regions FR of the support plates 501 and 502, the fourth adhesive film 931 may be formed over the entire surfaces of the folding region FR and the non-folding regions NFR1 and NFR2, and thus, a process of aligning the fourth adhesive film 931 may be omitted to reduce the occurrence of defects due to alignment errors.

As described above, since the adhesion force between the anti-adhesive patterns 631 and 632 and the lower film patterns 621 and 622 is less than the adhesion force between other laminated films, the anti-adhesive patterns 631 and 632 may be separated from the lower film patterns 621 and 622 while the display device 1 is folded. Specifically, the lower primer patterns 611 and 612 and the lower film patterns 621 and 622 may be attached to the support plates 501 and 502, whereas the anti-adhesive film patterns 631 and 632, the upper primer patterns 641 and 642, and the upper film patterns 651 and 652 may be attached to the flexible module 10 through the fourth adhesive film 931. Thus, while the display device 1 is folded, the flexible module 10 of the folding region FR is separated from the support plates 501 and 502, so that the bending of the support plates 501 and 502 in accordance with the flexible module 10 is prevented, and thus, the defects of the flexible module 10 due to the bending stress may be previously prevented.

As described above, when a laminate structure of the anti-adhesive patterns 601 and 602 is deformed, the operation of the display device 1 is changed according to the laminate structure.

In some exemplary embodiments, the anti-adhesive patterns 601 and 602 may include the anti-adhesive film patterns 631 and 632, respectively, and the anti-adhesive film patterns 631 and 632 may be disposed on the support plates 501 and 502, respectively. When the upper surfaces of the anti-adhesive film patterns 631 and 632 are attached to the fourth adhesive film 931, the anti-adhesive film patterns 631 and 632 may be separated from the support plates 501 and 502 while being attached to the fourth adhesive film 931.

In another exemplary embodiment, the anti-adhesive patterns 601 and 602 may include the anti-adhesive film patterns 631 and 632 and the lower film patterns 621 and 622, respectively, the lower film patterns 621 and 622 may be disposed on the support plates 501 and 502, respectively, the anti-adhesive film patterns 631 and 632 are disposed on the lower film patterns 621 and 622, respectively, and the upper surfaces of the anti-adhesive film patterns 631 and 632 are attached to the fourth adhesive film 931, respectively. In this case, the anti-adhesive patterns 601 and 602 may separated from the lower film patterns 621 and 622 to allow the lower film patterns 621 and 622 to be attached onto the support plates 501 and 502, whereas the anti-adhesive film patterns 631 and 632 may be attached to the flexible module 10 through the fourth adhesive film 931.

In some exemplary embodiments, the lower primer patterns 611 and 612 are further disposed between the lower film patterns 621 and 622 and the support plates 501 and 502, respectively; the lower primer patterns 611 and 612 are disposed on the support plates 501 and 502, respectively; and the lower film patterns 621 and 622 are disposed on the lower primer patterns 611 and 612, respectively. In this case, the lower primer patterns 611 and 612 and the lower film patterns 621 and 622 are attached to the support plates 501 and 502, respectively, whereas the anti-adhesive film patterns 631 and 632 may be attached to the flexible module 10 through the fourth adhesive film 931.

In still another exemplary embodiment, the anti-adhesive patterns 601 and 602 include the anti-adhesive film patterns 631 and 632 and the upper film patterns 651 and 652, the anti-adhesive film patterns 631 and 632 are disposed on the support plates 501 and 502, respectively, and the upper film patterns 651 and 652 are disposed on the anti-adhesive film patterns 631 and 632, respectively. In this case, the anti-adhesive film patterns 631 and 632 are separated from the support plates 501 and 502, and the anti-adhesive film patterns 631 and 632 and the upper film patterns 651 and 652 may be attached to the flexible module 10 through the fourth adhesive film 931.

In some exemplary embodiments, the upper primer patterns 641 and 642 are further disposed between the upper film patterns 651 and 652 and the anti-adhesive film patterns 631 and 632, respectively, the upper primer patterns 641 and 642 are disposed on the anti-adhesive film patterns 631 and 632, respectively, and the upper film patterns 651 and 652 are disposed on the upper primer patterns 641 and 642, respectively. In this case, the anti-adhesive film patterns 631 and 632 may be separated from the support plates 501 and 502, respectively, and the anti-adhesive film patterns 631 and 632, the upper primer patterns 641 and 642, and the upper film patterns 651 and 652 may be attached to the flexible module 10 through the fourth adhesive film 931.

Hereinafter, an exemplary method of manufacturing the above-described display device will be described.

FIGS. 6 to 9 are perspective views illustrating the processes of a method of manufacturing the display device according to an exemplary embodiment.

Figure 6:
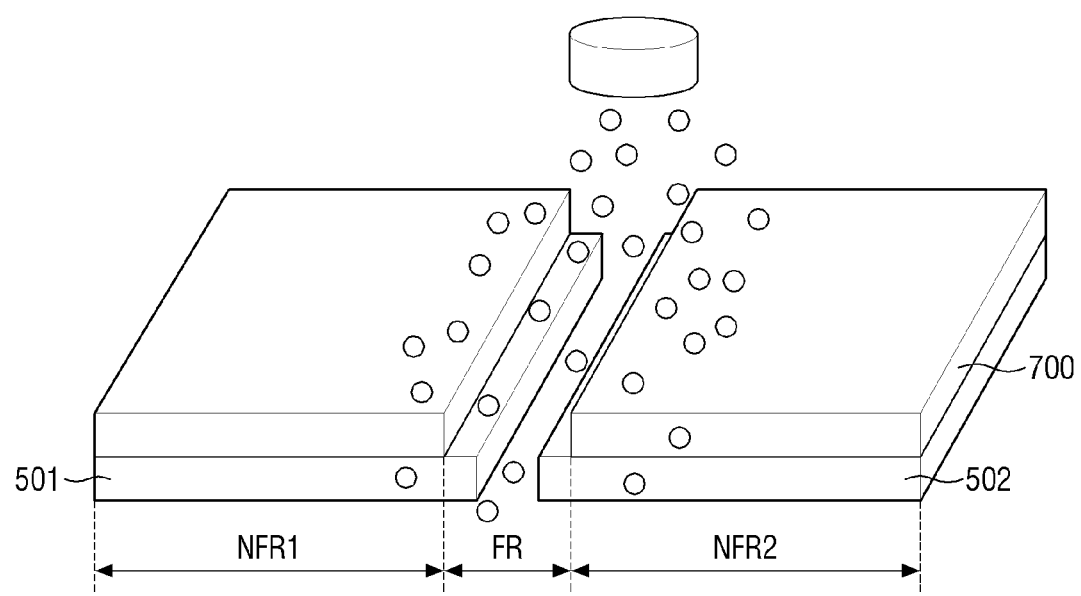
FIGS. 6, 7, 8, and 9 are perspective views illustrating the processes of a method of manufacturing the display device according to an exemplary embodiment.

Referring to FIG. 6, first and second support plates 501 and 502 are provided. The first support plate 501 is spaced apart from the second support plate 502 by a predetermined distance (distance D of FIG. 2). The first and second support plates 501 and 502 may be disposed in a folding region FR and non-folding regions NFR1 and NFR2. Since the folding region FR and the non-folding regions NFR1 and NFR2 have been described with reference to FIGS. 1 to 5, details thereof will be omitted.

Subsequently, a masking pattern 700 is disposed on the support plates 501, 502. The masking pattern 700 may be a masking tape. The masking pattern 700 may be disposed in the non-folding areas NFR1 and NFR2 of the support plates 501 and 502. The masking pattern 700 may cover the upper surfaces of the non-folding regions NFR1 and NFR2 of the support plates 501 and 502, and may exposes the folding region FR.

Next, a deposition apparatus is disposed above the support plates 501 and 502 on which the masking pattern 700 is disposed, and an anti-adhesive pattern material (refer to '600' in FIG. 7) is deposited on the support plates 501 and 502 on which the masking pattern 700 is disposed. The deposition apparatus may deposit an anti-adhesive pattern material over the region where the masking pattern 700 overlaps the support plates 501 and 502, the region where the upper surfaces of the support plates 501 and 502 are exposed, and the region where the support plates 501 and 502 are spaced apart from each other.

The deposition apparatus may be an apparatus for depositing an anti-adhesive pattern material. The anti-adhesive pattern material 600 may be a material of laminated films constituting the anti-adhesive patterns 601 and 602 of FIGS. 1 to 5. The anti-adhesive pattern material 600 may be a metal material. In the case of depositing the respective films, different vapor deposition apparatuses may be used. The deposition apparatus may be an apparatus for depositing a target material using heat, or a sputtering apparatus, but is not limited thereto.

The anti-adhesive pattern material includes an anti-adhesive film pattern material. As described above, the anti-adhesive pattern material is a metal material. In the case of depositing the metal material using an apparatus for depositing a target material using heat or a sputtering apparatus, the deposition rate of the metal material may be about 30 nm/min to about 50 nm/min. The deposited metal materials are easily bonded by a subsequent heat treatment process, such as annealing, and thus process efficiency may be improved.

Figure 7:
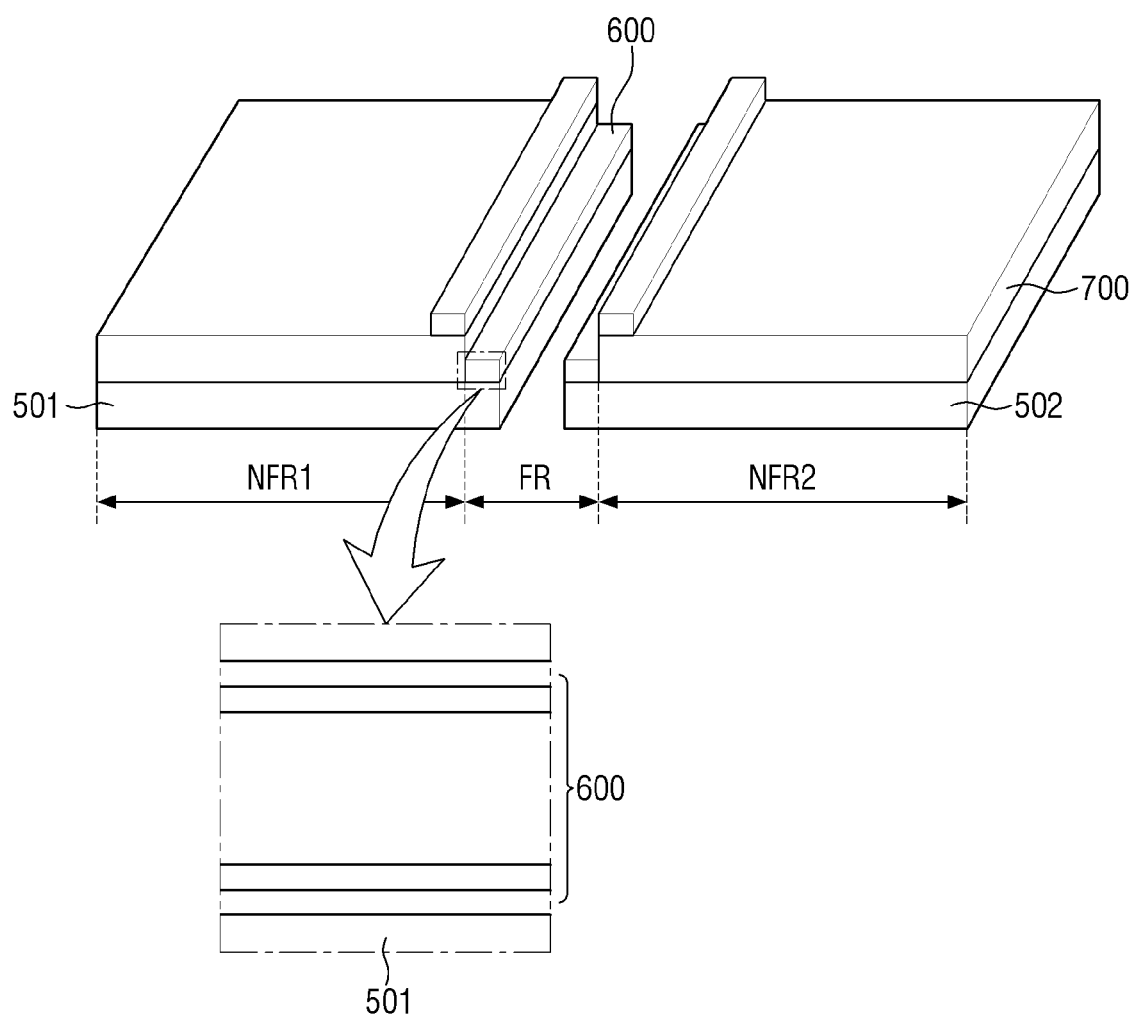

Referring to FIG. 7, the anti-adhesive pattern material 600 may be deposited on the support plates 501 and 502 and the masking pattern 700. Specifically, the anti-adhesive pattern material 600 may be deposited on the upper surfaces of the support plates 501 and 502, each being exposed by the masking pattern 700, and the upper surface of the masking pattern 700 adjacent thereto. Although not shown, the anti-adhesive pattern material 600 deposited on the exposed upper surfaces of the support plates 501 and 502 may be connected to the anti-adhesive pattern material 600 deposited on the upper surface of the masking pattern 700. That is, the step coverage of the anti-adhesive pattern material 600 on the inner side surface of the masking pattern 700 may be 0 to 1. However, when the masking pattern 700 has a thickness that is much greater than the thickness of the anti-adhesive pattern material 600, the step coverage thereof may be substantially 0 due to the step caused by the thickness of the masking pattern 700. That is, the anti-adhesive pattern material 600 deposited on the exposed upper surfaces of the support plates 501 and 502 may be disconnected from the anti-adhesive pattern material 600 deposited on the upper surface of the masking pattern 700.

Further, even when the anti-adhesive pattern material 600 deposited on the exposed upper surfaces of the support plates 501 and 502 is not connected to the anti-adhesive pattern material 600 deposited on the upper surface of the masking pattern 700, although not shown in FIG. 7, the anti-adhesive pattern material 600 deposited around the space where the support plates are spaced from each other may be disposed to extend inward from the inner side surface of each of the underlying support plates 501 and 502. Details thereof will be described later.

Figure 8:
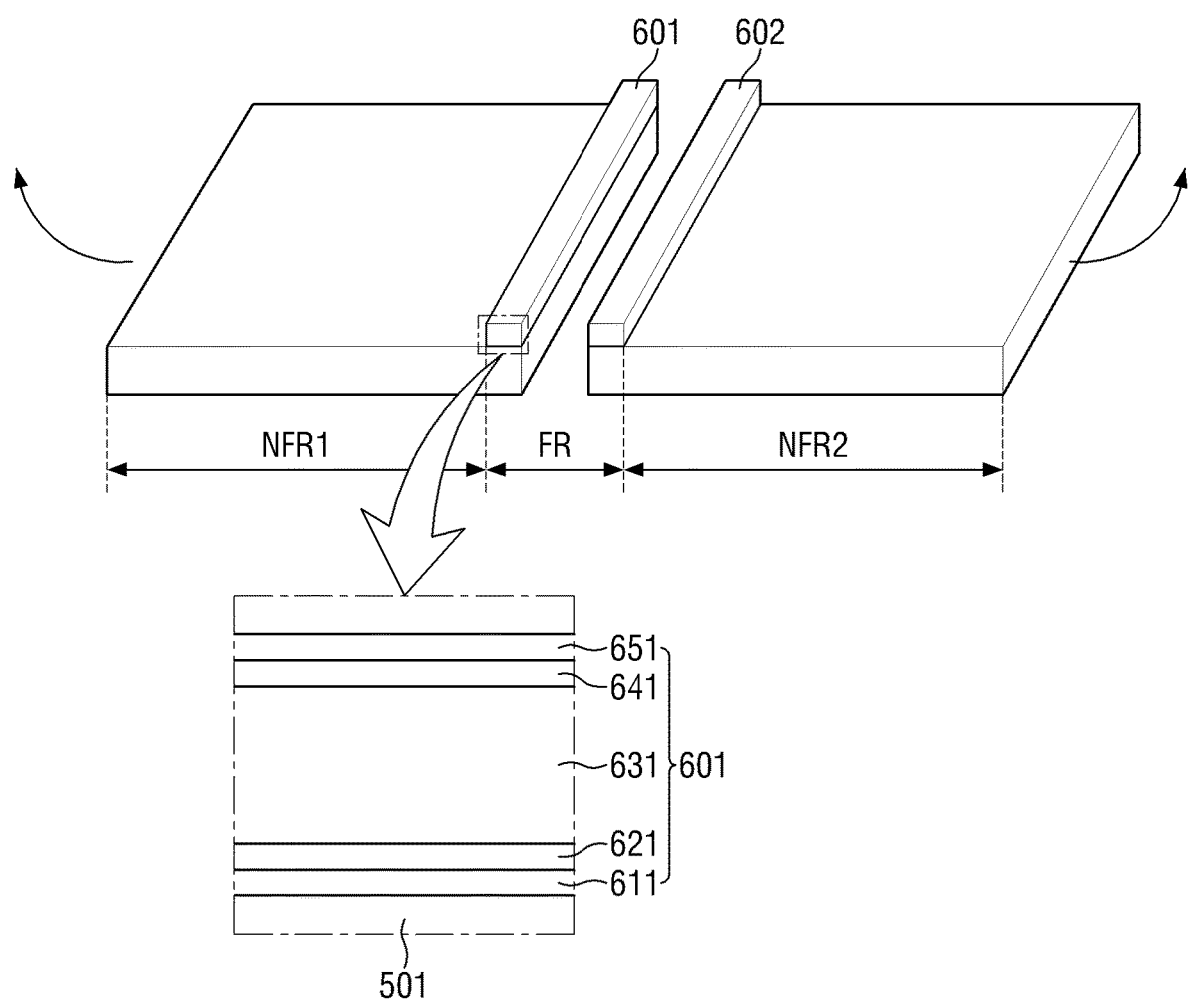

Referring to FIG. 8, the masking pattern 700 is detached from the support plates 501 and 502. Thus, the anti-adhesive pattern material deposited on the upper surface of the masking pattern is removed. Therefore, the anti-adhesive pattern material may be disposed only in a region corresponding to the folding regions FR of the support plates 501 and 502. The anti-adhesive pattern material may be disposed in the folding regions FR of the support plates 501 and 502 to form the anti-adhesive patterns 601 and 602. Since the laminate structure of each of the anti-adhesive patterns 601 and 602 has been described with reference to FIG. 3, details thereof will be omitted.

Figure 9:
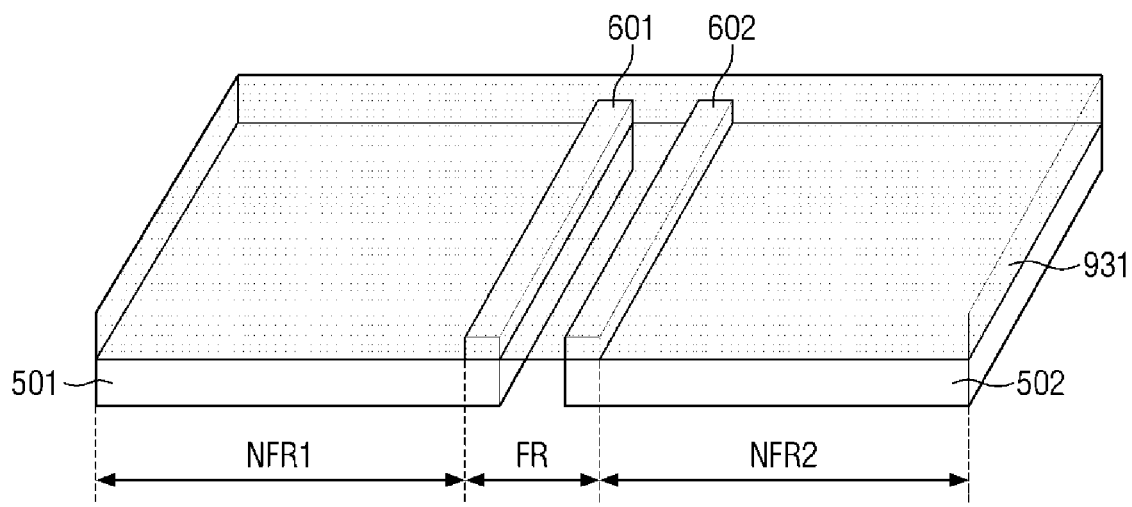

Referring to FIG. 9, a fourth adhesive film 931 may be disposed on the anti-adhesive patterns 601 and 602 and the support plates 501 and 502. The fourth adhesive film 931 may be integrally formed over the folding regions NFR1 and NFR2 and the folding region FR. The fourth adhesive film 931 may be formed to cover both the outer side surfaces and inner side surfaces of the anti-adhesive patterns 601 and 602. The process of disposing the fourth adhesive film 931 on the anti-adhesive patterns 601 and 602 may include a process of bonding each of the anti-adhesive patterns 601 and 602 to the fourth adhesive film 931. Thus, the first anti-adhesive film pattern 631 of the first anti-adhesive pattern 601 and the second anti-adhesive film pattern 632 of the second anti-adhesive pattern 602 may be transferred from the support plates 501 and 502 to the fourth adhesive film 931, respectively.

That is, referring to FIGS. 6 to 9, the method of manufacturing the display device according to an exemplary embodiment may include the processes: disposing a masking tape 700 on support plates 501 and 502 to partially expose one surfaces of the support plates 501 and 502; depositing an anti-adhesive pattern material 600 on the support plates 501 and 502 and the masking pattern 700; and removing the masking tape 700 from one surface of the support plates 501 and 502 to form a first anti-adhesive pattern 601 and a second anti-adhesive 602 separated from the first anti-adhesive pattern 601. The first anti-adhesive pattern 601 may include a first anti-adhesive film pattern 631, and the second anti-adhesive pattern 602 may include a second anti-adhesive film pattern 632. The method of manufacturing the display device may further include a process of disposing a fourth adhesive film 931 on the anti-adhesive patterns 601 and 602. Subsequently, the method of manufacturing the display device may further include a process of transferring the first anti-adhesive film pattern 631 and the second anti-adhesive film pattern 632 from the support plates 501 and 502 to the fourth adhesive film 931.

Figure 10:
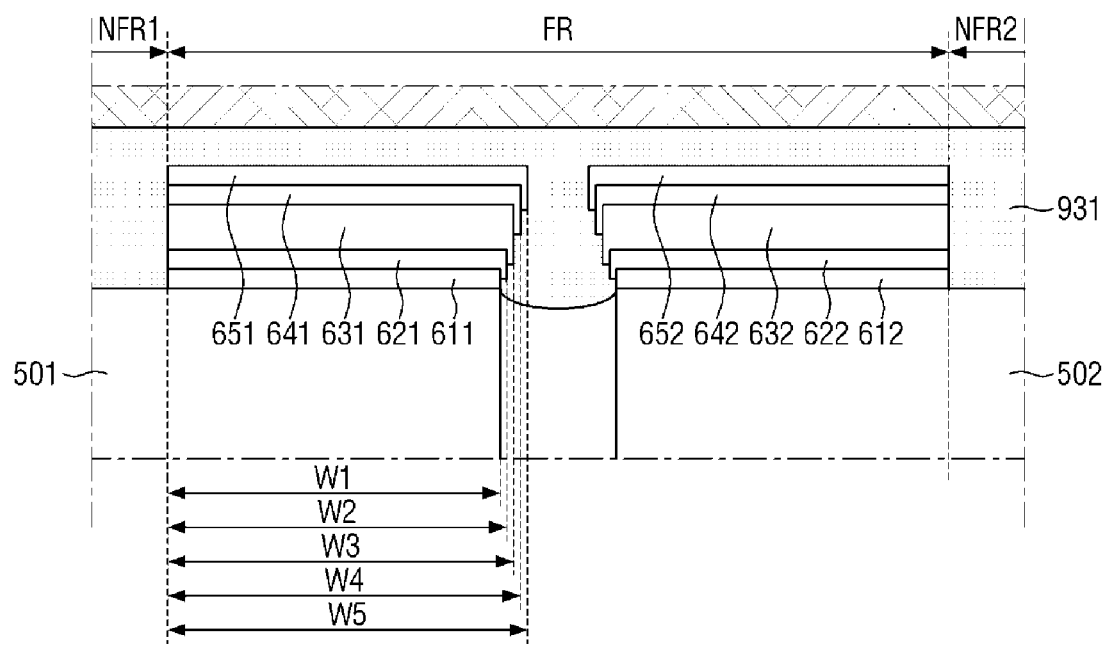
FIG. 10 is a view showing a modification example of the display device according to an exemplary embodiment.

Although not shown, the method of manufacturing the display device according to this exemplary embodiment may further include a process of disposing a flexible module in a direction opposite to the support plates 501 and 502 with the fourth adhesive film 931 therebetween and attaching the flexible module to the fourth adhesive film 931. FIG. 10 is a view showing a modification example of the display device according to an exemplary embodiment. FIG. 10 illustrates a case where an anti-adhesive pattern material deposited around the space where the support plates 501 and 502 are spaced apart from each other is deposited to extend inward from the inner side surface of each of the underlying support plates 501 and 502.

Referring to FIG. 10, the anti-adhesive patterns 601 and 602 according to this exemplary embodiment are different from those of the exemplary embodiment of FIGS. 1 to 5 in which laminated film patterns are aligned in the thickness direction, in that laminated film patterns have an undercut shape.

The inner side surfaces of the lower primer patterns 611 and 612 may be aligned with the inner side surfaces of the support plates 501 and 502 in the thickness direction, respectively. Each of the lower primer patterns 611 and 612 may have a first width W1.

The inner side surfaces of the lower film patterns 621 and 622 may protrude inward from the inner side surfaces of the support plates 501 and 502. A part of each of the lower film patterns 621 and 622 may partially cover the inner surface of each of the lower primer patterns 611 and 612. Each of the lower film patterns 621 and 622 may have a second width W2. The second width W2 may be greater than the first width W1.

The inner side surfaces of the anti-adhesive film patterns 631 and 632 may protrude inward from the inner side surfaces of the lower film patterns 621 and 622. The reason for this is that the lower film patterns 621 and 622 may be formed to extend inward from the inner side surfaces of the support plates 501 and 502, and the anti-adhesive film patterns 631 and 632 formed thereon may be formed even on the lower film patterns 621 and 622 extending inward and may be disposed even on the inner side surfaces of the lower film patterns 621 and 622 extending inward.

A part of each of the anti-adhesive film patterns 631 and 632 may partially cover the inner surface of each of the lower film patterns 621 and 622. Each of the anti-adhesive film patterns 631 and 632 may have a third width W3. The third width W3 may be greater than the second width W2.

The inner side surfaces of the upper primer patterns 641 and 642 may protrude inward from the inner side surfaces of the anti-adhesive film patterns 631 and 632. The reason for this is that the upper primer patterns 641 and 642 may be disposed not only on the anti-adhesive film patterns 631 and 632, but also in the anti-adhesive film patterns 631 and 632.

A part of each of the upper primer patterns 641 and 642 may partially cover the inner surface of each of the anti-adhesive film patterns 631 and 632. Each of the upper primer patterns 641 and 642 may have a fourth width W4. The fourth width W4 may be greater than the third width W3.

The inner side surfaces of the upper film patterns 651 and 652 may protrude inward from the inner side surfaces of the upper primer patterns 641 and 642. The reason for this is that the upper film patterns 651 and 652 may be disposed not only on the upper primer patterns 641 and 642, but also in the upper primer patterns 641 and 642.

A part of each of the upper film patterns 651 and 652 may partially cover the inner surface of each of the upper primer patterns 641 and 642. Each of the upper film patterns 651 and 652 may have a fifth width W5. The fifth width W5 may be greater than the fourth width W4.

Hereinafter, other exemplary embodiments will be described. In the following exemplary embodiments, the same components as those in the previously-described exemplary embodiments are referred to with the same reference numerals, and a description thereof will be omitted or simplified.

Figure 11:
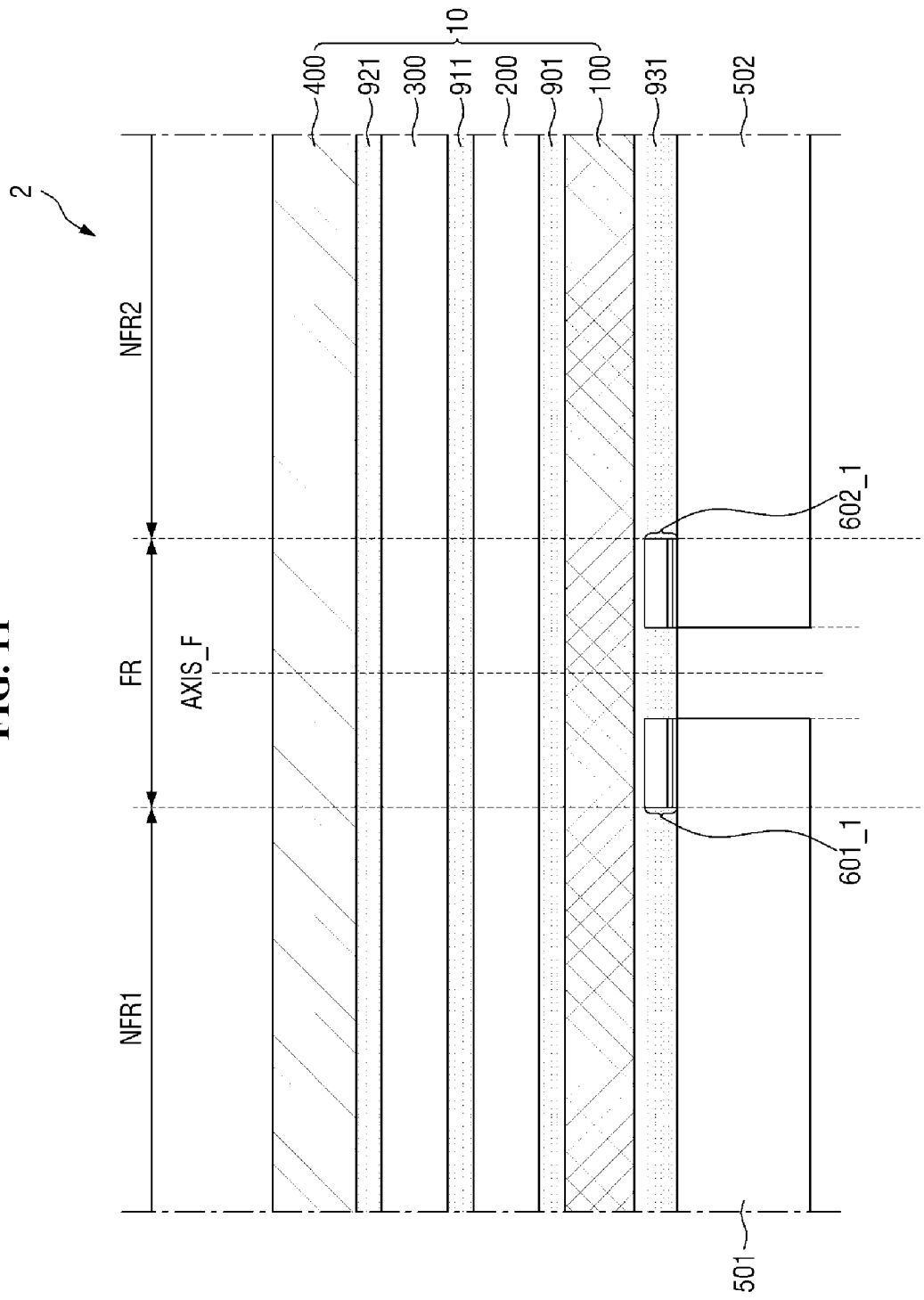
FIG. 11 is a cross-sectional view of a display device according to another exemplary embodiment.
Figure 12:
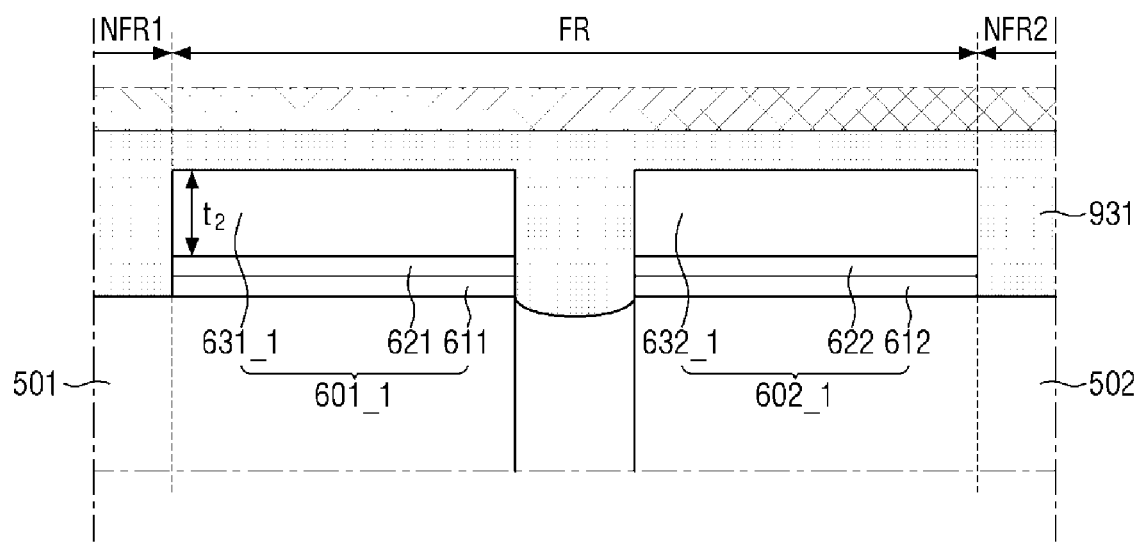
FIG. 12 is an enlarged view of a lower surface (or a back surface) of a flexible module of the display device according to another exemplary embodiment.

FIG. 11 is a cross-sectional view of a display device according to another exemplary embodiment; FIG. 12 is an enlarged view of a lower surface (or a back surface) of a flexible module of the display device according to another exemplary embodiment; and FIG. 13 is a cross-sectional view illustrating a folded state of the display device according to another exemplary embodiment.

Figure 13:
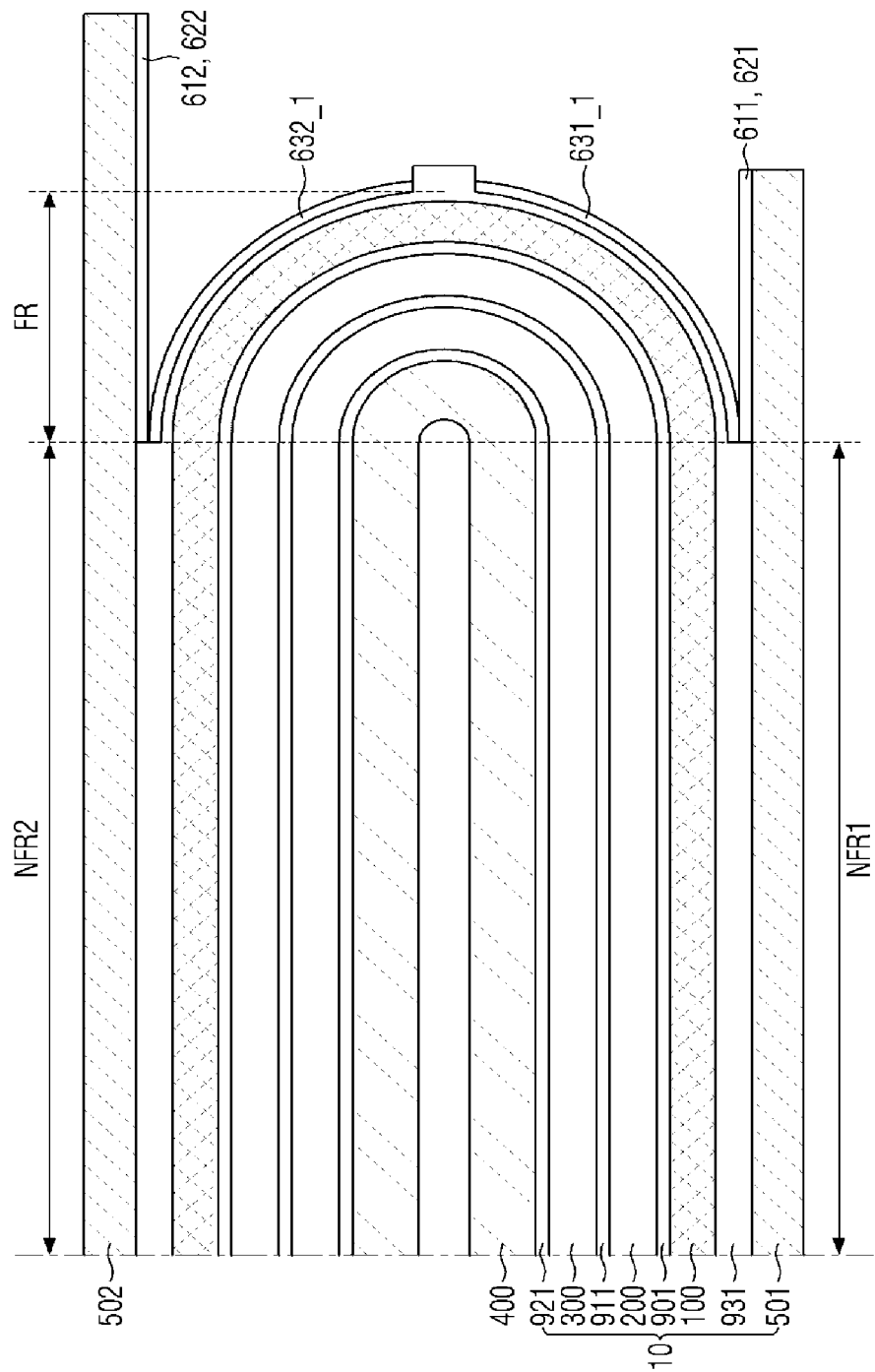
FIG. 13 is a cross-sectional view illustrating a folded state of the display device according to another exemplary embodiment.

Referring to FIGS. 11 to 13, a display device 2 is different from the display device 1 of FIGS. 1 to 5 in that anti-adhesive film patterns 631_1 and 632_1 include an organic material.

More specifically, the anti-adhesive patterns 601_1 and 602_1 may include lower primer patterns 611 and 612, lower film patterns 621 and 622, and anti-adhesive film patterns 631_1 and 632_1, which are sequentially laminated from the bottom, respectively.

The anti-adhesive film patterns 631_1 and 632_1 may include an organic material. Examples of the organic material may include an acrylic resin, an epoxy resin, a phenolic resin, a polyamide resin, a polyimide resin, an unsaturated polyester resin, a polyphenylene ether resin, a polyphenylene sulfide resin, and benzocyclobutene (BCB). For example, the anti-adhesive film patterns 631_1 and 632_1 may include polyurethane (PU).

Each of the anti-adhesive film patterns 631_1 and 632_1 may have a second thickness t2. The second thickness t2 may be substantially the same as the first thickness t1 in the thickness range. In an exemplary embodiment, the second thickness t2 may be about 1000 nm to about 2000 nm. The second thickness t2 of each of the anti-adhesive film patterns 631_1 and 632_1 may be considered in term of durability and thinning, as described above.

The adhesion force between the anti-adhesive film patterns 631_1 and 632_1 and the lower film patterns 621 and 622 may be less than the adhesion force between the lower film patterns 621 and 622 and the lower primer patterns 611 and 612 and the adhesion force between the lower primer patterns 611 and 612 and the support plates 501 and 502. Therefore, while the display device 2 is folded, the anti-adhesive film patterns 631 and 632 may be separated from the lower film patterns 621 and 622. Specifically, as shown in FIG. 13, the lower primer patterns 611 and 612 and the lower film patterns 621 and 622 are attached to the support plates 501 and 502, respectively, and the anti-adhesive film patterns 631_1 and 632_1 may be attached to the flexible module 10 through the fourth adhesive film 931. Thus, while the display device 1 is folded, the flexible module 10 of the folding region FR is separated from the support plates 501 and 502, so that the bending of the support plates 501 and 502 in accordance with the flexible module 10 is prevented, and thus, defects of the flexible module 10 due to the bending stress may be previously prevented.

Hereinafter, an exemplary method of manufacturing the aforementioned display device will be described.

FIGS. 14 to 18 are perspective views illustrating the processes of a method of manufacturing the display device according to another exemplary embodiment.

Figure 14:
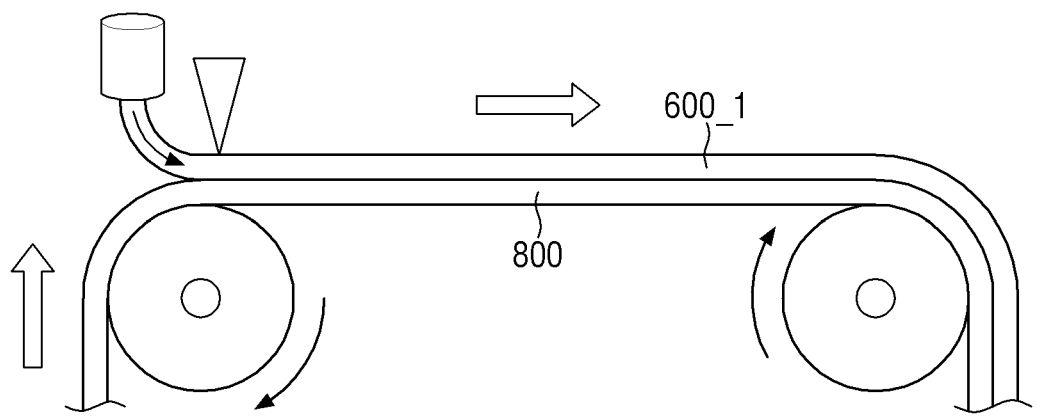
FIGS. 14, 15, 16, 17, and 18 are perspective views illustrating the processes of a method of manufacturing the display device according to another exemplary embodiment.
Figure 15:
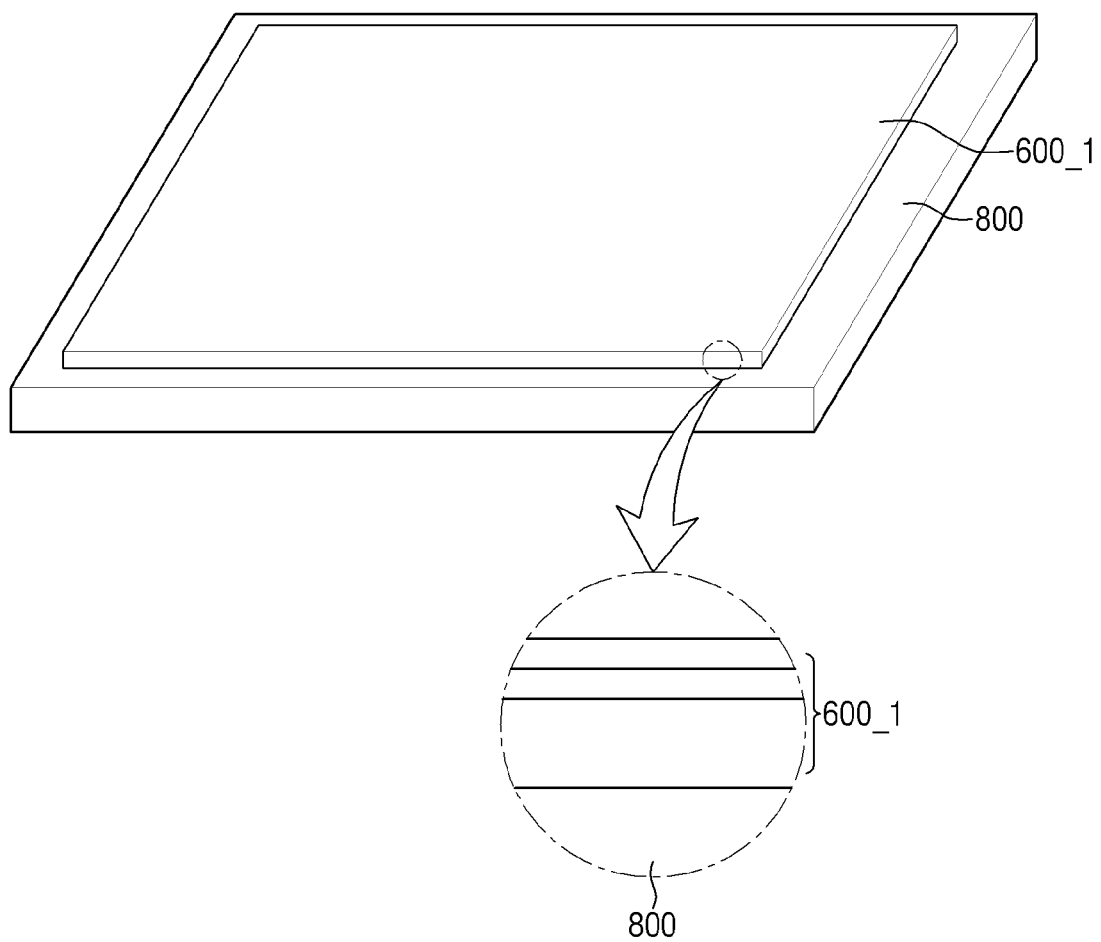

Referring to FIGS. 14 and 15, a release film 800 is provided. The release film 800 may include polyethylene terephthalate (PET), polycarbonate (PC), polyimide (PI), or paper. In order to increase the release force of the release film 800, the upper surface of the release film 800 may be treated with a silicon solution or may be provided thereon with a release coating layer including a silicon-based resin. However, the inventive concepts are not limited thereto.

Subsequently, an anti-adhesive pattern material 600_1 is disposed on the release film 800. The anti-adhesive pattern material 600_1 may be disposed on the release film 800 through a coating process using a roller apparatus of FIG. 14, which rotates while being fixed in place. An anti-adhesive pattern material may be applied on one surface of the release film 800, a lower film pattern material may be applied on the anti-adhesive pattern material, and a lower primer pattern material may be applied on the lower film pattern material. The anti-adhesive pattern material 600_1 may be an organic material layer.

Figure 16:
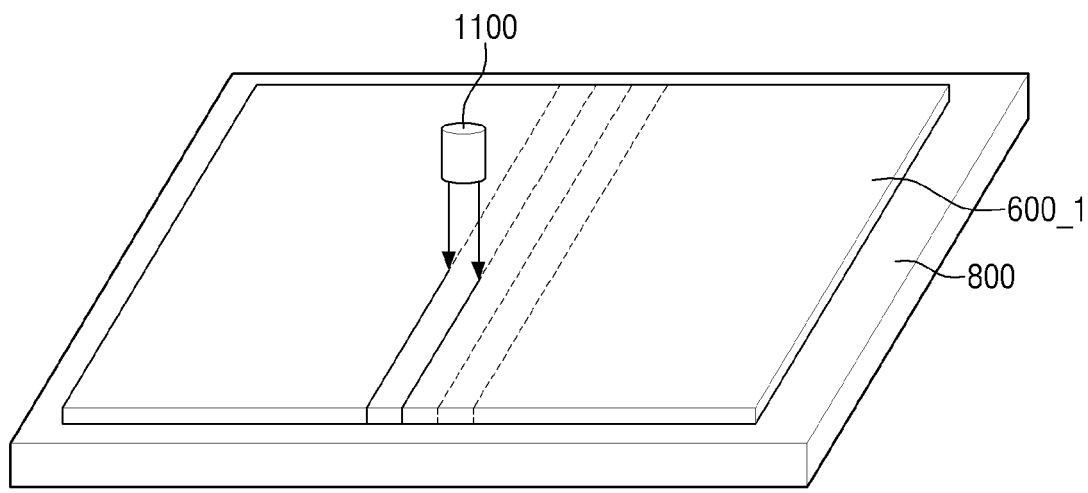
Figure 17:
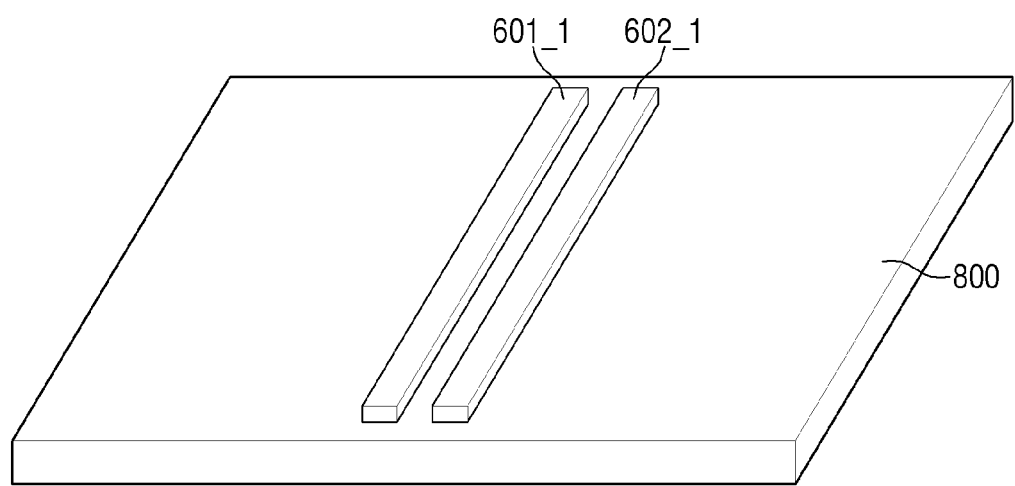
Figure 18:
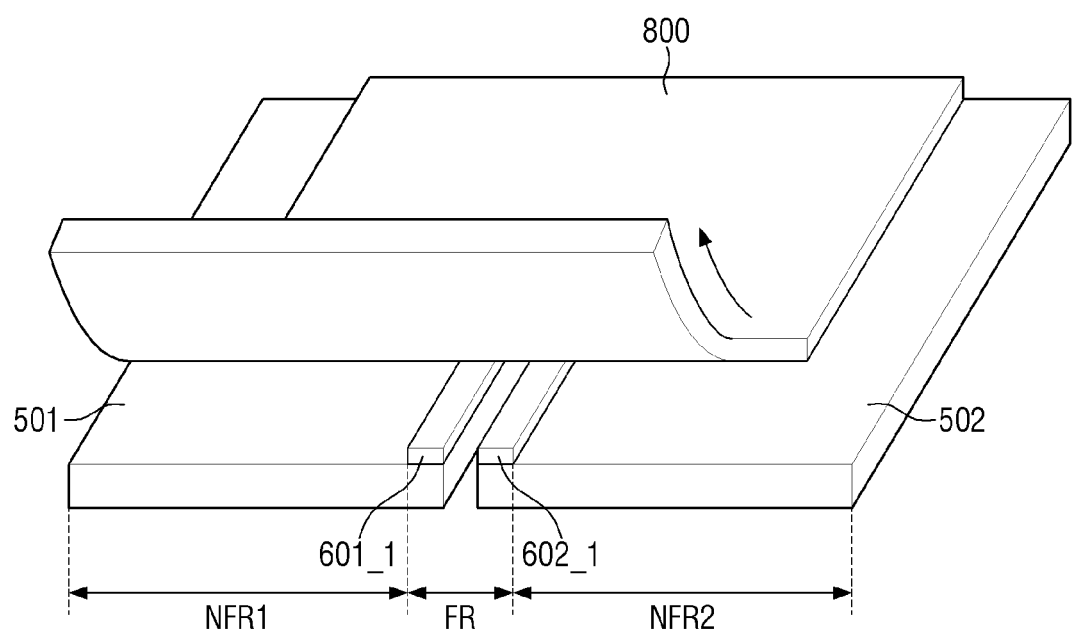

Referring to FIGS. 16 and 17, the anti-adhesive pattern material 600_1 disposed on the release film 800 is patterned. The process of patterning the anti-adhesive pattern material 600_1 may include a process of patterning the anti-adhesive pattern material 600_1 to have widths of anti-adhesive patterns 601_1 and 602_1 as shown in FIG. 18. The process of patterning the anti-adhesive pattern material 600_1 may include a process of scribing the anti-adhesive pattern material 600_1 using a cutting member 1100. The process of patterning the anti-adhesive pattern material 600_1 may further include a process of scribing the anti-adhesive pattern material 600_1 in a direction intersecting the thickness direction of each of the anti-adhesive patterns 601_1 and 602_1.

The cutting member 1100 may be, for example, a laser device or a knife. When a laser device is used as the cutting member 1100, the side surface of each of the anti-adhesive patterns 601_1 and 602_1, contacting the light emitted from the laser device, may be partially carbonized.

Although it is shown in FIG. 16 that the anti-adhesive patterns 601_1 and 602_1 are respectively patterned by the cutting member 1100, the inventive concepts are not limited thereto, and the anti-adhesive patterns 601_1 and 602_1 may be simultaneously scribed by the cutting member 1100. The first anti-adhesive pattern 601_1 may include a first anti-adhesive film pattern 631_1, and the second anti-adhesive pattern 602_1 may include a second anti-adhesive film pattern 632_1.

Referring to FIG. 18, the anti-adhesive patterns 601_1 and 602_1 disposed on the release film 800 may be aligned with the support plates 501 and 502, respectively. As shown in FIG. 18, the anti-adhesive patterns 601_1 and 602_1 may be aligned with the inner side surfaces of the support plates 501 and 502, respectively.

The process of disposing the release film 800 and the first anti-adhesive film pattern 631_1 and second anti-adhesive film pattern 632_1 formed on the release film 800 on the support plates 501 and 502 may further include a process of disposing the first anti-adhesive film pattern 631_1 and the second anti-adhesive film pattern 632_1 to respectively face the support plates 501 and 502.

Thus, the anti-adhesive patterns 601_1 and 602_1 may be attached to the upper surfaces of the support plates 501 and 502, respectively.

Although not shown, adhesive members are disposed on one surfaces of the anti-adhesive patterns 601_1 and 602_1 directly contacting the support plates 501 and 502 or one surfaces of the support plates 501 and 502 directly contacting the anti-adhesive patterns 601_1 and 602_1, and thus, the bonding between the support plates 501 and 502 and the anti-adhesive patterns 601_1 and 602_1 may be facilitated.

Then, the anti-adhesive patterns 601_1 and 602_1 may be detached from the release film 800 while being attached to the support plates 501 and 502. As described above, when a full tap portion protruding toward the outside of a plane profile of the release film 800 is formed, the release film 800 may be easily detached.

Next, a fourth adhesive film 931 may be disposed on the anti-adhesion patterns 601_1 and 602_1 exposed by the detached release film 800. The fourth adhesive film 931 may be formed to cover the anti-adhesive patterns 601_1 and 602_1. The fourth adhesive film 931 may cover the upper surface and both side surfaces of each of the anti-adhesive patterns 601_1 and 602_1. The fourth adhesive film 931 may directly contact the anti-adhesive patterns 631_1 and 632_1. The process of disposing the fourth adhesive film 931 on the anti-adhesion patterns 601_1 and 602_1 may include a process of attaching the anti-adhesive patterns 601_1 and 602_1 to the fourth adhesive film 931, respectively. Thus, the first anti-adhesive film pattern 631_1 of the first anti-adhesive pattern 601_1 and the second anti-adhesive film pattern 632_1 of the second anti-adhesive pattern 602_1 may be transferred from the support plates 501 and 502 to the fourth adhesive film 931, respectively.

Then, a flexible module 10 may be attached onto the fourth adhesive film 931. In some exemplary embodiments, the fourth adhesive film 931 may be first formed on the flexile module 10, and then attached to the anti-adhesive patterns 601_1 and 602_1 and the support plates 501 and 502.

In some exemplary embodiments, the anti-adhesion patterns 601_1 and 602_1 may be attached to the support plates 501 and 502, the release film 800 may not be detached, and the fourth adhesive film 931 may be disposed on the release film 800 provided thereon with the anti-adhesive patterns 601_1 and 602_1 to cover the upper surface and both side surfaces of each of the anti-adhesive patterns 601_1 and 602_1. In this case, the laminating order of the anti-adhesive patterns 601_1 and 602_1 may be changed vertically from that of the exemplary embodiment according to FIGS. 15 to 17. That is, lower primer patterns 611 and 612 may be formed on one surface of the release film 800, lower film patterns 621 and 622 may be formed on the lower primer patterns 611 and 612, and anti-adhesive patterns 601_1 and 602_1 may be formed on the lower film patterns 621 and 622. The anti-adhesive patterns 601_1 and 602_2 may be in direct contact with the fourth adhesive film 931.

Then, the release film 800 may be detached, and the anti-adhesive patterns 601_1 and 602_2 exposed by the release film 800 may be aligned with the support plates 501 and 502, respectively. That is, the lower primer patterns 611 and 612 may be attached to the support plates 501 and 502.

Next, a flexible module may be attached onto the fourth adhesive film 931. That is, the flexible module may be disposed in a direction opposite to the support plates 501 and 502 with the fourth adhesive film 931 therebetween to attach the flexible module to the fourth adhesive film 931.

In the above exemplary embodiment, the flexible module may be first attached onto the fourth adhesive film 931, and then the release film 800 may be detached to align the anti-adhesive patterns 601_1 and 602_2 with the support plates 501 and 502.

That is, referring to FIGS. 14 to 18, the method of manufacturing the display device according to another exemplary embodiment may include the processes: forming an anti-adhesive pattern material 600_1 on a release film 800; patterning the anti-adhesive pattern material 600_1 to form a first anti-adhesive pattern 601_1 and a second anti-adhesive pattern 602_1 separated from the first anti-adhesive pattern 601_1; disposing the release film 800 and the first anti-adhesive pattern 631_1 and second anti-adhesive pattern 632_1 formed on the release film 800 on support plates 501 and 502; separating the release film 800 from the first anti-adhesive pattern 631_1 and the second anti-adhesive pattern 632_1; disposing a fourth adhesive film 931 on the first anti-adhesive pattern 631_1 and the second anti-adhesive pattern 632_1; and transferring the first anti-adhesive pattern 631_1 and the second anti-adhesive pattern 632_1 from the support plates 501 and 502 to the fourth adhesive film 931.

Figure 19:
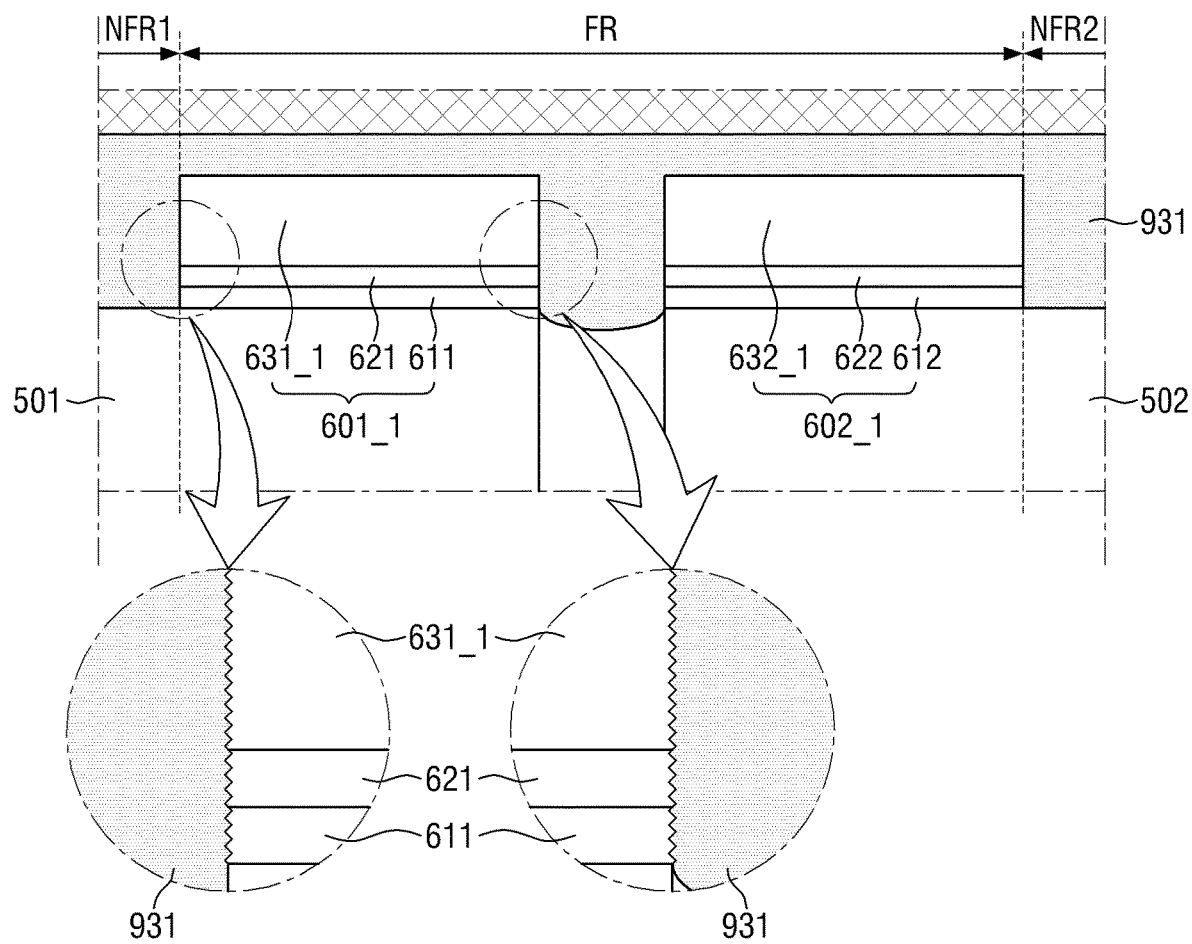
FIG. 19 is a view showing a modification example of the display device according to another exemplary embodiment.

FIG. 19 is a view showing a modification example of the display device according to another exemplary embodiment.

Referring to FIG. 19, this modification example is different from the exemplary embodiment of FIGS. 11 and 12 in that carbide contacting the side surfaces of the anti-adhesive patterns 601_1 and 602_1 are further included.

More specifically, as described above, when the anti-adhesive patterns 601_1 and 602_1 are patterned by a cutting member (refer to '1100' in FIG. 16), the side surfaces of the anti-adhesive patterns 601_1 and 602_1 contacting light emitted from the laser apparatus may be partially carbonized. When the light is in direct contact with the outer side surfaces and inner side surfaces of the anti-adhesive patterns 601_1 and 602_1, as shown in FIG. 19, carbide contacting the outer side surfaces and inner side surfaces of the anti-adhesive patterns 601_1 and 602_1 may be generated. The soot may have an uneven shape.

Figure 20:
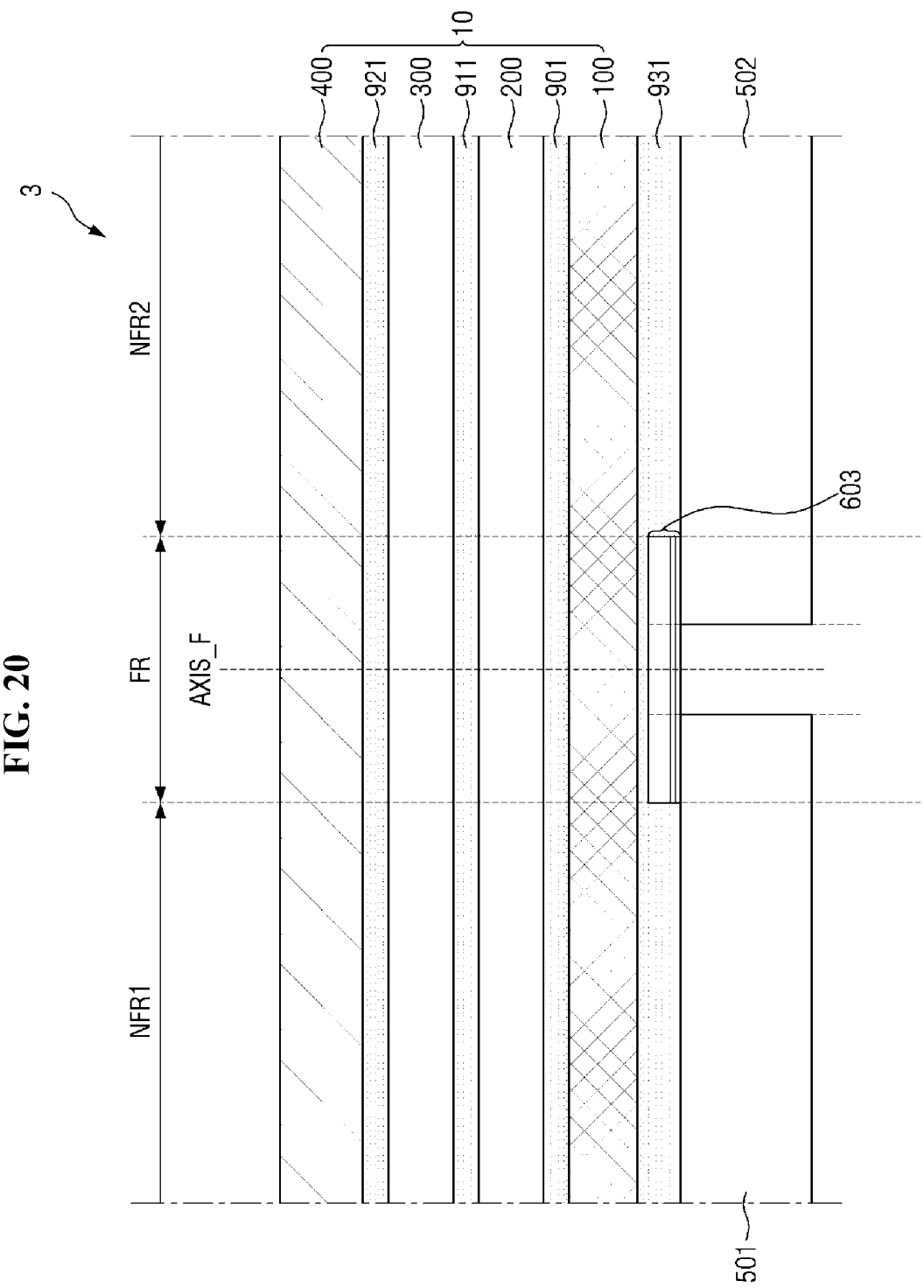
FIG. 20 is a cross-sectional view of a display device according to still another exemplary embodiment.
Figure 21:
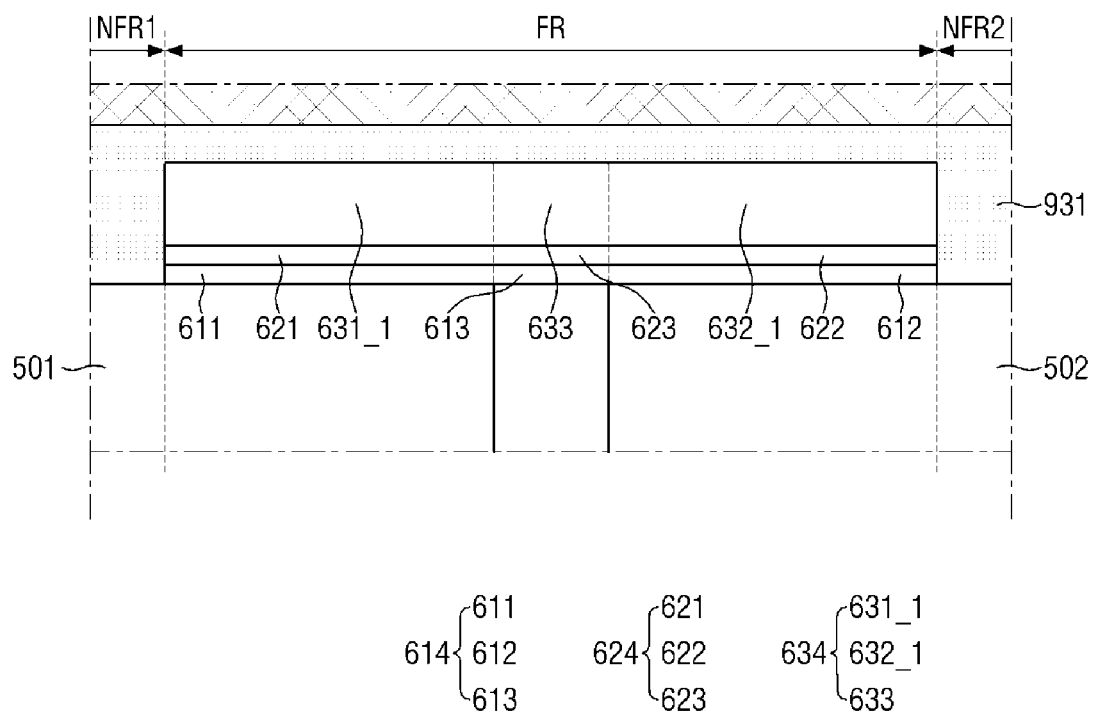
FIG. 21 is an enlarged view of a lower surface (or a back surface) of a flexible module of the display device according to still another exemplary embodiment.

FIG. 20 is a cross-sectional view of a display device according to still another exemplary embodiment, and FIG. 21 is an enlarged view of a lower surface (or a back surface) of a flexible module of the display device according to still another exemplary embodiment.

Referring to FIGS. 20 and 21, a display device 3 according to this exemplary embodiment is different from the display device 2 of FIGS. 11 and 12 in that an anti-adhesive pattern 603 is integrally formed.

More specifically, the anti-adhesive pattern 603 may be disposed between the support plates 501 and 502 and the fourth adhesive film 931, and may be integrally formed. That is, the lower primer pattern 614, the lower film pattern 624, and the anti-adhesive pattern 634 may be integrally formed. The anti-adhesive pattern 603 may be disposed over the folding region FR, and may be disposed to overlap a space between the support plates 501 and 502.

More specifically, the lower primer pattern 614 may include a first lower primer pattern 611, a second lower primer pattern 612, and a third connection pattern 613, one end thereof being connected to the first lower primer pattern 611 and the other end thereof being connected to the second lower primer pattern 612.

The lower film pattern 624 may include a first lower film pattern 621, a second lower film pattern 622, and a second connection pattern 623, one end thereof being connected to the first lower film pattern 621 and the other end thereof being connected to the second lower film pattern 622.

The anti-adhesive pattern 634 may include a first anti-adhesive pattern 631, a second anti-adhesive pattern 632, and a first connection pattern 633, one end thereof being connected to the first anti-adhesive pattern 631 and the other end thereof being connected to the second anti-adhesive pattern 632.

Each of the first to third connection patterns may overlap a space between the support plates 501 and 502 in the thickness direction.

Accordingly, the anti-adhesive pattern 603 is still disposed under the fourth adhesive film 931 overlapping a space between the support plates 501 and 502, and thus it is possible to prevent the fourth adhesive film 931 from being damaged by foreign matter or the like.

Hereinafter, an exemplary method of manufacturing the aforementioned display device will be described.

Figure 22:
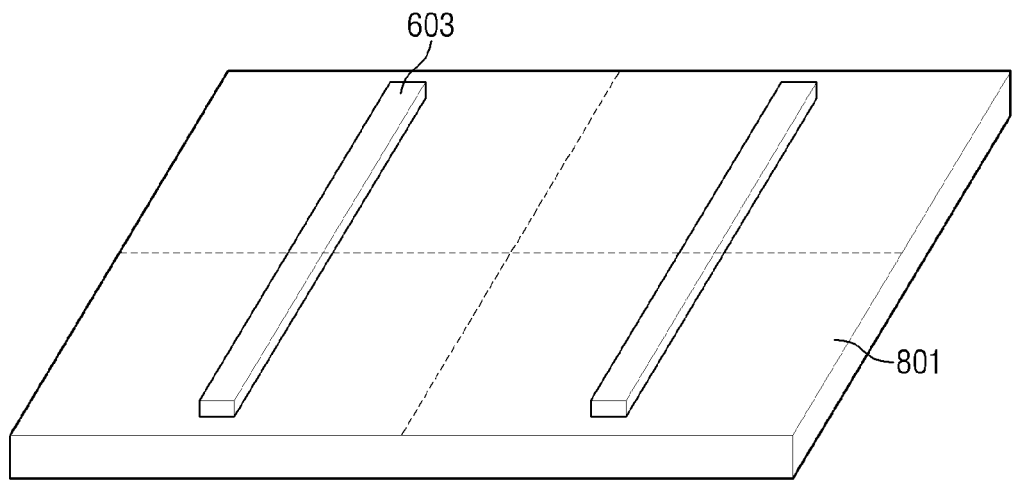
FIGS. 22, 23, and 24 are perspective views illustrating the processes of a method of manufacturing the display device according to still another exemplary embodiment.
Figure 23:
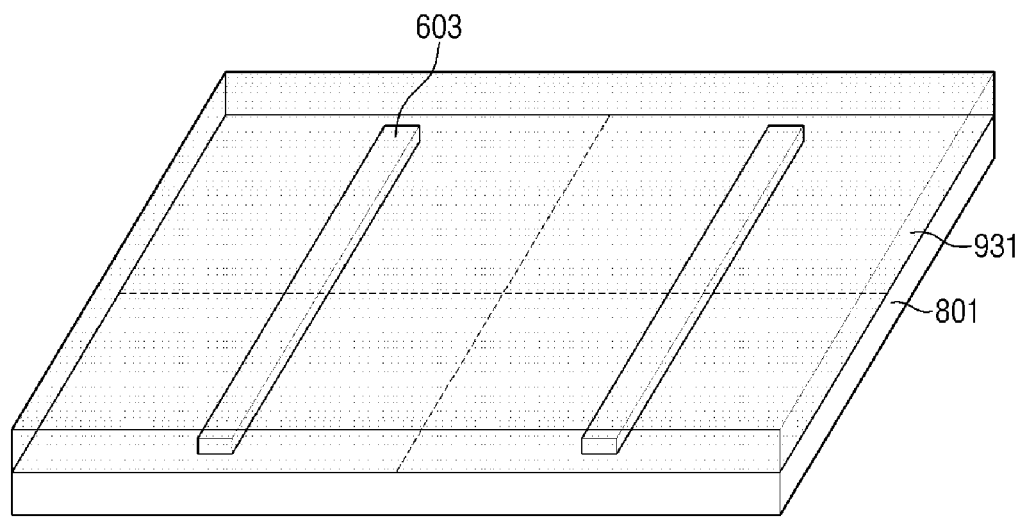
Figure 24:
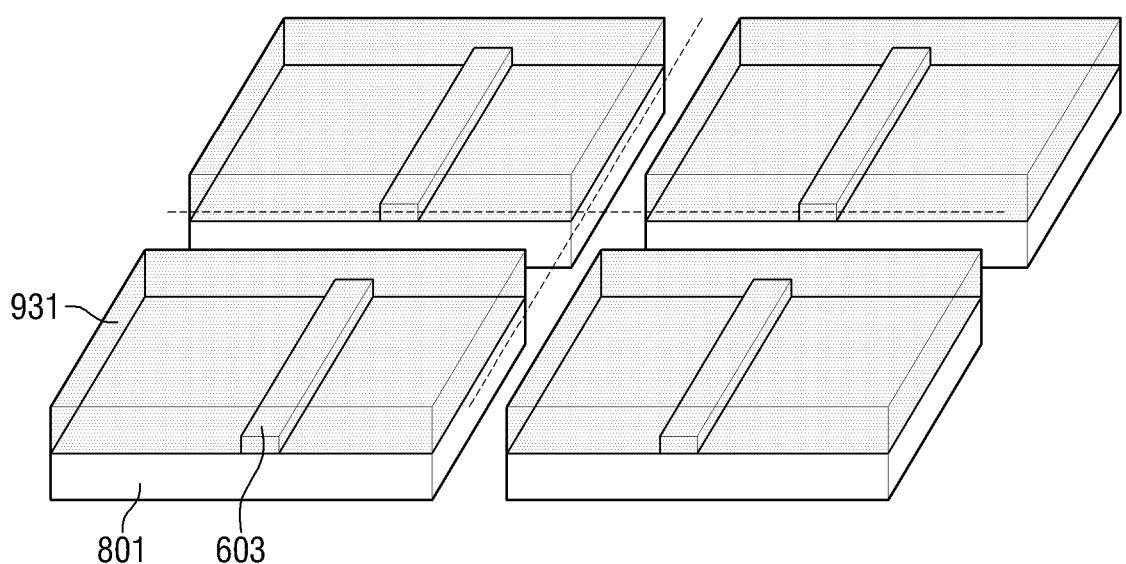

FIGS. 22 to 24 are perspective views illustrating the processes of a method of manufacturing the display device according to another exemplary embodiment.

Referring to FIG. 22, a release film 801 is provided. The release film 800 of FIG. 15 is an individual film forming the anti-adhesive patterns 601_1 and 602_1 of an individual display device, whereas this release film 801 may be a raw film forming the anti-adhesive pattern 603 of a plurality of display devices.

Subsequently, an anti-adhesive pattern material 600_1 may be disposed on the release film 801 through a coating process in the same manner as that shown in FIGS. 14 and 15.

Next, the anti-adhesive pattern material 600_1 disposed on the release film 801 is patterned. Although it is shown in FIG. 16 that each of the anti-adhesive patterns 601_1 and 602_1 of one display device is patterned by the cutting member 1100, in this exemplary embodiment, the anti-adhesive patterns 603 of a plurality of display devices may be simultaneously formed by the cutting member 1100 in a unit of a raw film.

Referring to FIG. 23, a fourth adhesive film 931 may be formed on release film 801 provided with the plurality of anti-adhesive patterns 603 to cover the plurality of anti-adhesive patterns 603. The fourth adhesive film 931 may be formed to cover the upper surface and both side surfaces of each of the plurality of anti-adhesive patterns 603. That is, the upper surface and both side surfaces of each of the plurality of anti-adhesive patterns 603 may be covered by the fourth adhesive film 931.

Referring to FIG. 24, when the release film 801, the plurality of anti-adhesive patterns 603, and the fourth adhesive film 931, which are attached to each other, are cut into a cross shape, four individual structures (each 801, 603, 931) are obtained.

Although it is shown in FIG. 24 that the release film 801, the plurality of anti-adhesive patterns 603 disposed on the release film 801, and the fourth adhesive film 931 disposed on the release film 801 are cut into the four individual structures (each 801, 603, 931), the number of individual structures (each 801, 603, 931) may be changed depending on the number of cutting lines. That is, two, three, or five individual structures (each 801, 603, 931) may be obtained from the release film 801, the plurality of anti-adhesive patterns 603 disposed on the release film 801, and the fourth adhesive film 931 disposed on the release film 801.

Subsequently, the release film 801 may be detached from the individual anti-adhesive pattern 603 and the fourth adhesive film 931.

Then, the anti-adhesive pattern 603 and the fourth adhesive film 931 may be aligned with the support plates 501 and 502.

In the aforementioned exemplary embodiment, the flexible module may be disposed on the anti-adhesive pattern 603 and the fourth adhesive film 931 and then disposed to be aligned with the support plates 501 and 502.

Figure 25:
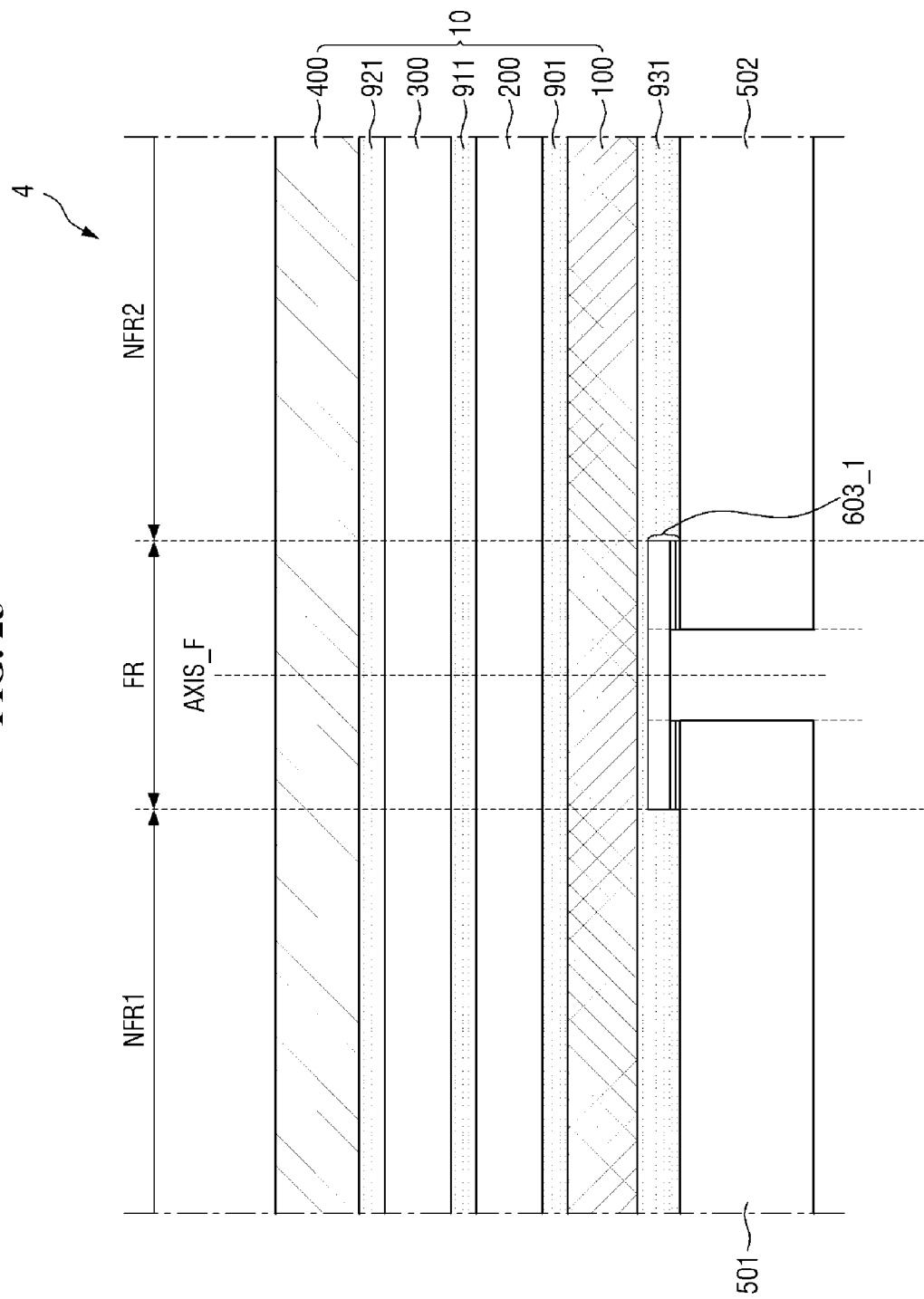
FIG. 25 is a cross-sectional view of a display device according to still another exemplary embodiment.
Figure 26:
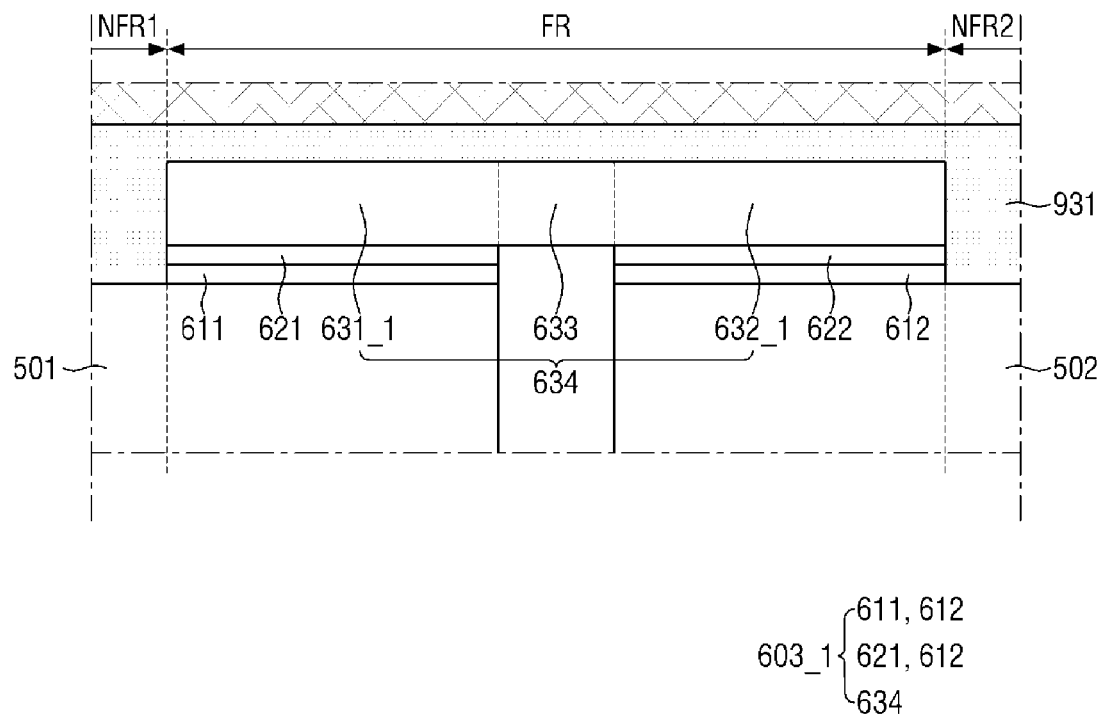
FIG. 26 is an enlarged view of a lower surface (or a back surface) of a flexible module of the display device according to still another exemplary embodiment.

FIG. 25 is a cross-sectional view of a display device according to still another embodiment, and FIG. 26 is an enlarged view of a lower surface (or a back surface) of a flexible module of the display device according to still another exemplary embodiment.

Referring to FIGS. 25 and 26, an anti-adhesive pattern 603_1 according to this exemplary embodiment is different from that according to the exemplary embodiment of FIGS. 20 and 21 in that the inner side surfaces of the lower primer patterns 611 and 612 and the lower film patterns 621 and 622 are aligned with the inner side surfaces of the support plates 501 and 502.

More specifically, in the anti-adhesive pattern 603_1 according to this embodiment, the anti-adhesive pattern 603_1, similarly to that shown in FIGS. 20 and 21, is integrally formed through the first connection pattern 633, whereas, similarly to the support plates, the lower primer patterns 611 and 612 may be spaced apart from the lower film patterns 621 and 622. The inner side surfaces of the lower primer patterns 611 and 612 and the lower film patterns 621 and 622 may be aligned with the inner side surfaces of the support plates 501 and 502 in the thickness direction.

Since the adhesion force between the anti-adhesive pattern 633 and the lower film patterns 621 and 622 is less than the adhesion force between other layers, the anti-adhesive pattern 633 may be separated from the lower film patterns 621 and 622. That is, the lower film patterns 621 and 622 and the lower primer patterns 611 and 612 are attached to the support plates 501 and 502, whereas the anti-adhesive pattern 634 may be attached to the flexible module 10 through the fourth adhesive film 931.

According to this exemplary embodiment, the lower film patterns 621 and 622 and the lower primer patterns 611 and 612, attached to the support plates 501 and 502, may be spaced to overlap a space between the support plates 501 and 502. While the display device 4 is folded, the lower film patterns 621 and 622 and the lower primer patterns 611 and 612 may be separated from each other, like the support plates 501 and 502. Thus, it is possible to prevent the lower film patterns 621 and 622 and the lower primer patterns 611 and 612 from being damaged by bending stress in accordance with the state switching of the display device 4.

As described above, according to exemplary embodiments of the present invention, it is possible to provide a display device with overcome defects due to repetitive state switching between a folded state and an unfolded state.

Although certain exemplary embodiments have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device, comprising:
a flexible module including a display panel;
an adhesive film disposed on one surface of the flexible module;
support plates disposed on the adhesive film;
a first anti-adhesive film pattern disposed between each of the support plates and the adhesive film;
a first lower film pattern disposed between the first anti-adhesive film pattern and each of the support plates;
a second anti-adhesive film pattern disposed between each of the support plates and the adhesive film and spaced apart from the first anti-adhesive film pattern; and
a second lower film pattern disposed between the second anti-adhesive film pattern and each of the support plates and separated from the first lower film pattern,
wherein:
each of the support plates includes a metal material;
each of the first anti-adhesive film pattern and the second anti-adhesive film pattern includes a metal material;
each of the first anti-adhesive film pattern and the second anti-adhesive film pattern has a thickness in a range of 100 nm to 1000 nm; and
each of the first anti-adhesive film pattern and the second anti-adhesive film pattern is disposed on the adhesive film and is separated from each of the first lower film pattern and the second lower film pattern in a folding state.

2. The display device of claim 1, wherein the support plates comprise a first support plate and a second support plate which face the flexible module and are spaced apart from each other.

3. The display device of claim 2, wherein the first anti-adhesive film pattern overlaps the first support plate, and the second anti-adhesive film pattern overlaps the second support plate.

4. The display device of claim 3, wherein the first anti-adhesive film pattern and the second anti-adhesive film pattern comprise the same material.

5. The display device of claim 3, wherein:
an adhesion force between the first anti-adhesive film pattern and the adhesive film is greater than an adhesion force between the first anti-adhesive film pattern and the first support plate; and
an adhesion force between the second anti-adhesive film pattern and the adhesive film is greater than an adhesion force between the second anti-adhesive film pattern and the second support plate.

6. The display device of claim 3, wherein each of the first anti-adhesive film pattern and the second anti-adhesive film pattern has a thickness in a range of 200 nm to 400 nm.

7. The display device of claim 3, further comprising:
a first upper film pattern disposed between the first anti-adhesive film pattern and the adhesive film; and
a second upper film pattern disposed between the second anti-adhesive film pattern and the adhesive film,
wherein each of the first upper film pattern and the second upper film pattern comprises an organic material or a metal oxide.

8. The display device of claim 3, wherein the adhesive film is in contact with both side surfaces of the first anti-adhesive film pattern and both side surfaces of the second anti-adhesive film pattern.

9. The display device of claim 7, wherein:
an adhesion force between the first anti-adhesive film pattern and the first upper film pattern is greater than an adhesion force between the first anti-adhesive film pattern and the first support plate; and
an adhesion force between the second anti-adhesive film pattern and the second upper film pattern is greater than an adhesion force between the second anti-adhesive film pattern and the second support plate.

10. The display device of claim 9, wherein the first upper film pattern and the second upper film pattern comprise the same material.

11. The display device of claim 7, wherein each of the first upper film pattern and the second upper film pattern has a thickness in a range of 10 nm to 100 nm.

12. The display device of claim 7, further comprising:
a first upper primer pattern disposed between the first upper film pattern and the first anti-adhesive film pattern; and
a second upper primer pattern disposed between the second upper film pattern and the second anti-adhesive film pattern.

13. The display device of claim 12, wherein each of the first upper primer pattern and the second upper primer pattern comprises a non-metallic oxide material.

14. The display device of claim 13, wherein the first upper primer pattern and the second upper primer pattern comprise the same material.

15. The display device of claim 3, wherein:
the first lower film pattern is disposed between the first anti-adhesive film pattern and the first support plate; and
the second lower film pattern is disposed between the second anti-adhesive film pattern and the second support plate and separated from the first lower film pattern.

16. The display device of claim 15, wherein:
an adhesion force between the first lower film pattern and the first support plate is greater than an adhesion force between the first lower film pattern and the first anti-adhesive film pattern; and
an adhesion force between the second lower film pattern and the second support plate is greater than an adhesion force between the second lower film pattern and the second anti-adhesive film pattern.

17. The display device of claim 15, wherein each of the first lower film pattern and the second lower film pattern comprises at least one of olefin molecules, silicone molecules, long-chain alkyl molecules, and fluorine molecules.

18. The display device of claim 17, wherein the first lower film pattern and the second lower film pattern comprise the same material, and each of the first lower film pattern and the second lower film pattern has a thickness in a range from 10 nm to 100 nm.

19. The display device of claim 15, further comprising:
a first lower primer pattern disposed between the first lower film pattern and the first support plate; and
a second lower primer pattern disposed between the second lower film pattern and the second support plate.

20. The display device of claim 19, wherein each of the first lower primer pattern and the second lower primer pattern comprises a non-metallic oxide material.

21. The display device of claim 20, wherein the first lower primer pattern and the second lower primer pattern comprises the same material.

22. The display device of claim 3, wherein:
the adhesive film is in direct contact with the first support plate in a region not overlapping the first anti-adhesive film pattern; and
the adhesive film is in direct contact with the second support plate in a region not overlapping the second anti-adhesive film pattern.

23. The display device of claim 3, wherein:
the flexible module is defined by a first non-folding region, a second non-folding region, and a folding region disposed between the first non-folding region and the second non-folding region;
the first support plate overlaps the first non-folding region;
the second support plate overlaps the second non-folding region; and
a space between the first support plate and the second support plate overlaps the folding region.

24. The display device of claim 23, wherein the first anti-adhesive film pattern overlaps the first non-folding region, and the second anti-adhesive film pattern overlaps the second non-folding region.

25. A display device, comprising:
a flexible module comprising a display panel;
an adhesive film disposed on one surface of the flexible module;
support plates disposed on the adhesive film;
a first anti-adhesive film pattern disposed between each of the support plates and the adhesive film; and
a second anti-adhesive film pattern disposed between each of the support plates and the adhesive film and spaced apart from the first anti-adhesive film pattern,
wherein:
each of the support plates includes a metal material;
each of the first anti-adhesive film pattern and the second anti-adhesive film pattern has a thickness in a range of 1000 nm to 2000 nm;
each of the first anti-adhesive film pattern and the second anti-adhesive film pattern comprises an organic material; and
each of the first anti-adhesive film pattern and the second anti-adhesive film pattern is disposed on the adhesive film and is separated from each of the first lower film pattern and the second lower film pattern in a folding state.

26. The display device of claim 25, wherein the support plates comprise a first support plate and a second support plate which face the flexible module and are spaced apart from each other.

27. The display device of claim 26, wherein the first anti-adhesive film pattern overlaps the first support plate, and the second anti-adhesive film pattern overlaps the second support plate.

28. The display device of claim 27, wherein the first anti-adhesive film pattern and the second anti-adhesive film pattern comprise the same material.

29. The display device of claim 28, wherein the organic material comprises polyurethane (PU).

30. The display device of claim 27, wherein:
an adhesion force between the first anti-adhesive film pattern and the adhesive film is greater than an adhesion force between the first anti-adhesive film pattern and the first support plate; and
an adhesion force between the second anti-adhesive film pattern and the adhesive film is greater than an adhesion force between the second anti-adhesive film pattern and the second support plate.

31. The display device of claim 27, wherein:
the first lower film pattern is disposed between the first anti-adhesive film pattern and the first support plate; and
the second lower film pattern is disposed between the second anti-adhesive film pattern and the second support plate and separated from the first lower film pattern.

32. The display device of claim 31, wherein:
an adhesion force between the first lower film pattern and the first support plate is greater than an adhesion force between the first lower film pattern and the first anti-adhesive film pattern; and
an adhesion force between the second lower film pattern and the second support plate is greater than an adhesion force between the second lower film pattern and the second anti-adhesive film pattern.

33. The display device of claim 31, wherein each of the first lower film pattern and the second lower film pattern comprises at least one of olefin molecules, silicone molecules, long-chain alkyl molecules, and fluorine molecules.

34. The display device of claim 31, further comprising a first connection pattern, one side thereof being connected to the first anti-adhesive film pattern and the other side thereof being connected to the second anti-adhesive film pattern.

35. The display device of claim 34, wherein the first connection pattern is disposed to overlap a space between the first support plate and the second support plate.

36. The display device of claim 34, wherein the first connection pattern, the first anti-adhesive film pattern, and the second anti-adhesive film pattern comprise the same material.

37. The display device of claim 34, further comprising a second connection pattern, one side thereof being connected to the first lower film pattern and the other side thereof being connected to the second lower film pattern.

38. The display device of claim 37, wherein the second connection pattern is disposed to overlap a space between the first support plate and the second support plate.

* * * * *